United States Patent
Shrivastava

(10) Patent No.: US 9,531,359 B1
(45) Date of Patent: Dec. 27, 2016

(54) MULTI-STATE ATTENUATOR

(71) Applicant: Peregrine Semiconductor Corporation, San Diego, CA (US)

(72) Inventor: Ravindranath Shrivastava, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 14/878,750

(22) Filed: Oct. 8, 2015

(51) Int. Cl.
  G05F 3/20 (2006.01)
  H03K 17/693 (2006.01)
  H03K 5/08 (2006.01)
  H03K 17/687 (2006.01)

(52) U.S. Cl.
  CPC .............. *H03K 5/08* (2013.01); *H03K 17/687* (2013.01)

(58) Field of Classification Search
  USPC ....... 327/101, 103, 308, 327, 328, 403, 404; 333/81 R
  See application file for complete search history.

(56) References Cited

U.S. PATENT DOCUMENTS

| | | |
|---|---|---|
| 5,049,841 A | 9/1991 | Cooper et al. |
| 5,157,323 A * | 10/1992 | Ali .................. H03H 11/245 323/369 |
| 8,135,369 B2 * | 3/2012 | Yamakawa ......... H03H 11/245 327/308 |
| 9,397,635 B2 | 7/2016 | Costa |
| 2013/0043962 A1 | 2/2013 | Granger-Jones |
| 2014/0002214 A1 | 1/2014 | Bawell et al. |
| 2014/0253248 A1 | 9/2014 | Ahmed et al. |

OTHER PUBLICATIONS

Shrivastava, Ravindranath, "Digital Step Attenuator", patent application filed in the USPTO on Jan. 14, 2016, U.S. Appl. No. 14/996,078, 59 pgs.

Rosswag, Isabella, International Search Report and Written Opinion received from the EPO dated Oct. 27, 2016 for appln. No. PCT/US2016/043212, 17 pgs.

Durham, et al., "Circuit Architectures for High Linearity Monolithic Continuous-Time Filtering", 8090B IEEE Transactions on Circuits and Systems II: Analog and Digital Signal Processing, vol. 39 (1992) Sep., No. 9, New York, US, pp. 651-657.

* cited by examiner

*Primary Examiner* — An Luu
(74) *Attorney, Agent, or Firm* — Jaquez Land Greenhaus LLP; Martin J. Jaquez, Esq.; John Land, Esq.

(57) ABSTRACT

Multi-state radio frequency (RF) attenuator configurations that include bridged-T type, pi-type, and T-type structures each having a programmable throughput section and a coupled programmable shunt section. The throughput sections and shunt sections may be configured in various combinations of parallel and serial fixed or selectable resistance elements such that multiple resistance states and impedance matching states can be programmatically selected, and may include stacked switch elements to withstand applied voltages to a specified design level.

49 Claims, 15 Drawing Sheets

MULTI-STATE ATTENUATOR

BACKGROUND (1) Technical Field

This invention relates to electronic circuits, and more particularly to multi-state attenuator circuits.

(2) Background

An attenuator is an electronic device that reduces the power of a signal without appreciably distorting its waveform. An attenuator is functionally the opposite of an amplifier (although the two work by different methods)—while an amplifier provides gain, an attenuator provides loss (or, equivalently, a gain less than one). Classic examples of radio frequency (RF) attenuators are bridged-T type, pi-type, T-type, and L-pad type attenuators.

A multi-state attenuator may be formed with switched resistive elements for varying the circuit configuration and attenuation values. An example of one type of multi-state attenuator is shown in U.S. Pat. No. 5,157,323, entitled "Switched Low-Loss Attenuator", issued Oct. 20, 1992 to Ali et al.

It appears that the circuit design taught in the '323 patent essentially teaches a signal line with IN and OUT terminals coupled to multiple parallel shunt circuits and to multiple parallel attenuation circuits (see FIGS. 1 and 2 of the '323 patent). It appears that any of the multiple parallel shunt circuits can be activated at a particular time, as can any of the multiple parallel attenuation circuits.

One benefit of the circuit taught in the '323 patent is that a single composite structure defines all of the attenuation states, thereby reducing the cumulative insertion loss required in conventional series-connected "cascaded" design approaches. However, a drawback of the circuit type taught in the '323 patent is that it does not provide for handling of high power signals, or provide flexibility of design for various applications.

The present invention is addresses these limitations.

SUMMARY OF THE INVENTION

In many applications involving RF signals and in which attenuators are used, it is important to be able to handle high input power but with low insertion loss and parasitic effects, and with minimal effect on chip area and power dissipation on an integrated circuit (IC) die (or "chip"). Such applications include, for example, antenna-transceiver RF signal paths and low noise amplifiers (LNAs) in radio-based systems, such as cellular telephones, WiFi, and the like. The present invention is directed to providing several multi-state attenuator configurations which are capable of handling high power signals, have low insertion loss and parasitic effects, have few or no glitches between state transitions, have minimal effect on chip area and power dissipation on an IC chip, and provide flexibility of design for various applications.

More particularly, the present invention includes bridged-T type, pi-type, T-type, and L-pad type multi-state attenuator configurations each having a programmable throughput section and a coupled programmable shunt section. The inventive concepts encompass various combinations of parallel and serial fixed or selectable resistances such that multiple resistance states and impedance matching states can be programmatically selected, and may include stacked switch elements to withstand applied voltages to a specified design level. The selectable resistances are either normally in-circuit (i.e., normally connected but bypassable) or normally out-of-circuit (i.e., normally disconnected but switchably connectable).

The throughput sections may include (without limitation) at least the following configurations, alone or in combination: parallel sets of individually selectable series resistances; a set of series-connected selectable resistances, with or without a bypassable resistive element; parallel sets of selectable series resistances, some of which may have plural series-connected selectable augmenting resistances; tiered bypassable series resistances, and a programmable matrix of selectable resistance elements.

Similarly, the inventive concepts described above more generally encompass shunt sections having various combinations of a series shunt plus other fixed or selectable resistance and/or impedance matching elements such that multiple impedance matching states can be programmatically selected, and may include stacked switch elements to withstand applied voltages to a specified design level. The shunt sections may include (without limitation) at least the following configurations: a stacked main shunt switch in series with at least one fixed resistance and one or more series-connected bypassable resistances; a stacked main shunt switch in series with at least one fixed resistance and one or more parallel sets of series-connected bypassable resistances; and at least two stacked main shunt switches each in series with at least one fixed resistance and one or more sets of series and/or parallel and/or series-parallel connected bypassable resistances. In addition, the configurations used for the throughput section resistance elements may also be applied to the shunt section resistance elements in appropriate applications, alone or in combination.

Another aspect of the invention is the combination of parallel and/or serial fixed and/or selectable resistances along with configuration selection switches to create a multifunctional variable-type (e.g., bridged-T type, pi-type, T-type, and/or L-pad type) multi-state attenuator.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

In many applications involving RF signals and in which attenuators are used, it is important to be able to handle high input power but with low insertion loss and parasitic effects, and with minimal effect on chip area and power dissipation on an integrated circuit (IC) die (or "chip"). Such applications include, for example, antenna-transceiver RF signal paths and low noise amplifiers (LNAs) in radio-based systems, such as cellular telephones, WiFi, and the like. The present invention is directed to providing several multi-state attenuator configurations which are capable of handling high power signals, have low insertion loss and parasitic effects, have few or no glitches between state transitions, have minimal effect on chip area and power dissipation on an IC chip, and provide flexibility of design for various applications.

More particularly, the present invention includes bridged-T type, pi-type, T-type, and L-pad type multi-state attenuator configurations each having a programmable throughput section and a coupled programmable shunt section, such that multiple attenuation states and corresponding impedance matching states may be programmatically selected, as described below.

Bridged-T Type Multi-State Attenuator

Figure 1:
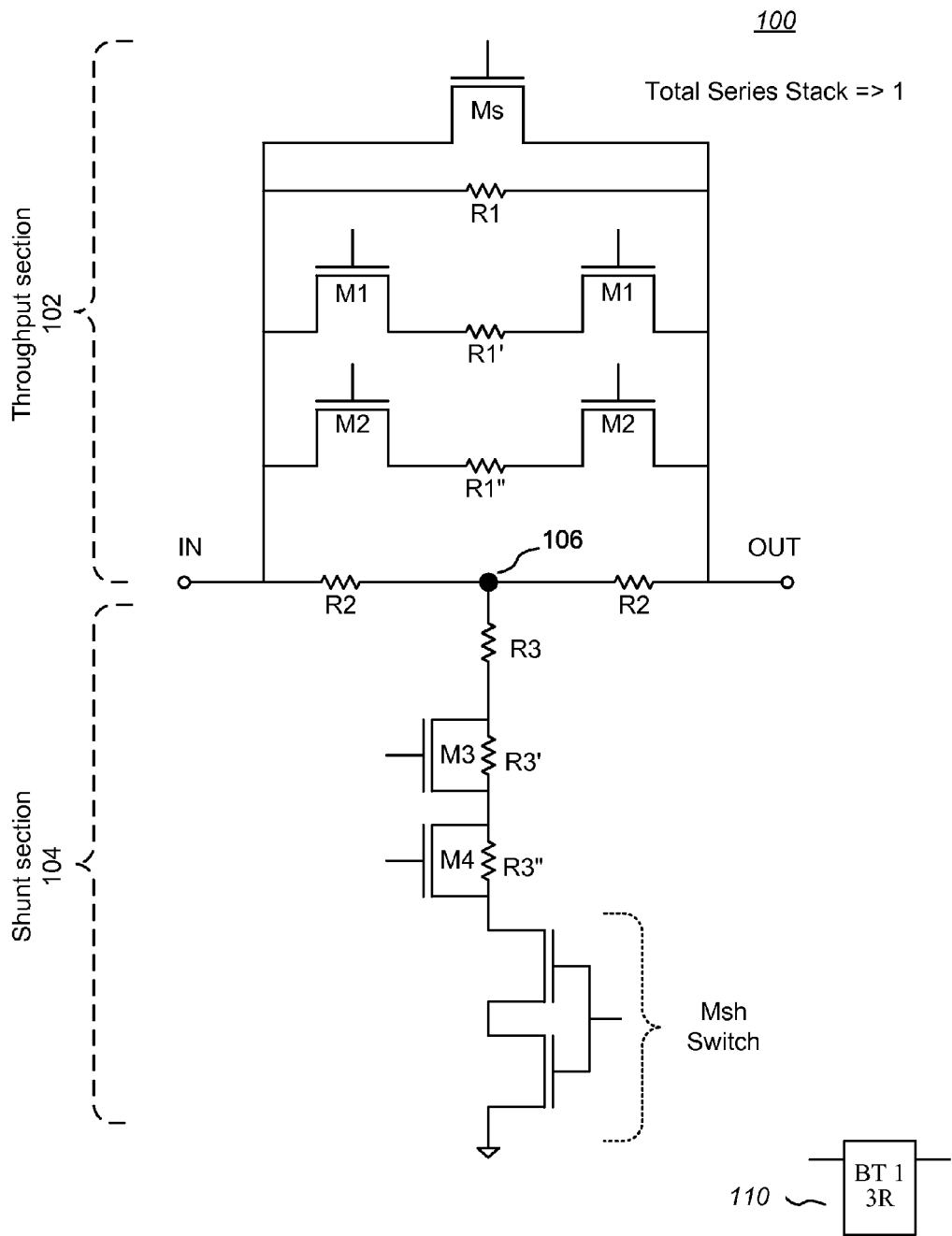
FIG. 1 is a schematic diagram of one embodiment of a bridged-T multi-state attenuator in accordance with the present invention.

FIG. 1 is a schematic diagram of one embodiment of a bridged-T multi-state attenuator 100 in accordance with the present invention. The multi-state attenuator 100 includes an input terminal IN, and output terminal OUT, and two programmable operational sections that work in conjunction with each other: a throughput section 102 and a shunt section 104. Note that the multi-state attenuator 100 is symmetrical, and accordingly the roles and labels for the IN and OUT terminals may be reversed in general.

In the illustrated example, the throughput section 102 includes a set of resistors R1, R1', R1", and a set of switches Ms, M1, M2, coupled as shown to form four selectable signal paths in parallel with the two R2 resistors and serially connected between the IN terminal and the OUT terminal. By suitable setting of switches Ms, M1, M2 (see below for detail), the selectable signal paths are:

(1) through series switch Ms, bypassing R1, R1' and R1";
(2) through only R1;
(3) through only R1 and R1' (i.e., R1∥R1'); and
(4) through R1, R1', and R1" (i.e., R1∥R1'∥R1").

Thus, the resistors R1, R1', R1" may be progressively selected. Optionally, one more attenuation combination can be implemented if desired, through only R1 and R1", which would require adding a bypassable shunt resistor in the shunt section 104 to correspond with the R1∥R1" combination. In an alternative embodiment, by adding isolating switches around resistor R1, any one of the set of resistors R1, R1', R1" may be individually selected without selecting any of the other resistors, Accordingly, all combinations of such resistors would be available, which would provide one through state and 7 attenuation states: R1, R1', R1", (R1∥R1'), (R1∥R1"), (R1' ∥R1") and (R1∥R1' ∥R1"). In such a case, the shunt section 104 would have to be modified to provide a selectable corresponding matching impedance for each of the 7 states. As should be clear, other numbers of selectable paths can be embodied in a similar bridged-T multi-state attenuator configuration.

The shunt section 104 includes a set of series connected resistors R3, R3', R3", and a set of switches Msh, M3, M4. The shunt section 104 is coupled between a reference voltage (usually circuit ground) and a node 106 between the two R2 resistors of the throughput section 102. Switches M3 and M4 allow bypassing of corresponding resistors R3' and R3" (optionally, resistor R3 may be made bypassable as well). The purpose of resistors R3' and R3" and their corresponding bypass switches M3 and M4 is to selectively add or subtract resistance in series with resistor R3 in the shunt path in order to maintain a suitable impedance matching characteristic (typically 50 ohms) as the resistors R1, R1', R1" are switched into or out of circuit.

The switches in the illustrated example are preferably field-effect transistors (FETs), which may be implemented in any of a number of technologies, as described below. In this example, the Msh (shunt) switch is shown as a stack of FETs all controlled by a common signal so as to switch ON or OFF concurrently, and thus the stack behaves like a single switch. Like-named switches (e.g., M1, M2) are also switched ON or OFF concurrently. Each switch includes a control line that enables setting the switch to an ON (or CLOSED) conductive state, or to an OFF (or OPEN) non-conductive or blocking state, and thus behaves as a single-pole, single-throw switch. Each control line would be coupled to other circuitry (not shown), which may be internal or external; for example, control signals may be provided to the switch control lines through the well-known serial peripheral interface (SPI) bus, directly or through combinatorial logic circuitry or a mapping circuit (e.g., a lookup table).

In the example shown in FIG. 1, the multi-state attenuator 100 has 4 selectable states: an A0 "THROUGH" state with essentially zero attenuation (ignoring the negligible resistance of the Ms switch and connecting conductors), and A1, A2, and A3 attenuation states. In essence, the illustrated multi-state attenuator 100 consists of three "over-laid" bridged-T type attenuator circuits, all of which may be bypassed in the THROUGH state. The electrical characteristics of a conventional non-multi-state bridged-T type attenuator are well known, and accordingly are not detailed here; only characteristics of note are described below.

For the A0 "THROUGH" (no attenuation) state, switch Ms is ON and switch Msh is OFF. Thus, a signal applied to the IN terminal is routed through the Ms switch directly to the OUT terminal. Since a signal passing from IN to OUT is effectively traversing a fully conductive path through ON switch Ms, and the path to circuit ground is isolated by OFF switch Msh, the states of the other switches M1, M2, M3, and M4 can be either ON or OFF.

For the A1 attenuation state, where the selected signal path is only through R1, switches M3, M4, and Msh are ON and switches Ms, M1, and M2 are OFF. This configuration will place R1 in-circuit bridging the two R2 resistors, while node 106 is coupled to circuit ground only through R3 and the Msh switch.

For the A2 attenuation state, where the selected signal path is only through R1 and R1', switches M1, M4, and Msh are ON and switches Ms, M2, and M3 are OFF. This configuration will place R1 and R1' in parallel and in-circuit, bridging the two R2 resistors, while node 106 is coupled to circuit ground through R3, R3', and the Msh switch.

For the A3 attenuation state, where the selected signal path is through R1, R1', and R1", switches M1, M2, and Msh are ON and switches Ms, M3, and M4 are OFF. This configuration will place R1, R1', and R1" in parallel and in-circuit, bridging the two R2 resistors, while node 106 is coupled to circuit ground through R3, R3', R3", and the Msh switch.

As should be clear, other numbers of attenuation states can be embodied in a similar bridged-T multi-state attenuator configuration by adding additional throughput section 102 selectable paths and corresponding shunt section 104 elements. Further, the design can accommodate other levels of attenuation per attenuation state. In addition, the shunt resistors R3, R3', R3" (with any corresponding bypass switches) in the shunt section 104 can be in any physical order because they are series connected.

In some embodiments, the shunt resistors R3, R3', R3" may be implemented as FETs. A designer may have to stack more than one FET to get a desired amount of $R_{ON}$ resistance. The shunt resistors may also be implemented with one or more FETs biased in the triode region to behave as voltage controlled variable resistors, where the $R_{ON}$ of each FET is controlled by the amount of gate voltage applied to the gate of the FET.

TABLE 1 summarizes the switch settings for the four selectable states of the embodiment shown in FIG. 1 ("0" means OFF, "1" means ON, and "x" means "don't care"):

TABLE 1

| Through State/ Attenuation State | Ms | Msh | M1 | M2 | M3 | M4 |
|---|---|---|---|---|---|---|
| A0 | 1 | 0 | x | x | x | x |
| A1 | 0 | 1 | 0 | 0 | 1 | 1 |
| A2 | 0 | 1 | 1 | 0 | 0 | 1 |
| A3 | 0 | 1 | 1 | 1 | 0 | 0 |

Operationally, using the terminology above, attenuation state A1 provides the most amount of attenuation, since attenuation states A2 and A3 progressively add parallel resistors in the throughput section 102, thus lowering the total resistance of the parallel signal paths. Example values for the attenuation states may be A1=1.5 dB, A2=1.0 dB, and A3=0.5 dB. Concurrently, series resistors are added in the shunt section 104 for impedance matching purposes. The values of the throughput section 102 resistors R1, R1', R1" and of the shunt section 104 impedance matching resistors R3, R3', R3" are selected to achieve a particular desired amount of attenuation per attenuation state with proper impedance matching, and can be readily determined by computation, simulation, or by conventional experimentation. It is convenient to select resistor values so that the attenuation states have a progressive attenuation relationship (e.g., 0.5 dB, 1.0 dB, and 1.5 dB, or 2 dB, 4 dB, and 6 dB).

Stack Sizing

If switch stacking is used, as in the case of an Msh switch configured as a stack of FETs, all of the FET switches in a stack are concurrently switched, and thus behave like a single switch. An advantage of stacked FETs for the Msh switch in shunt section 104 is the ability to handle input power to the IN terminals (or to the OUT terminal, since the terminals are generally interchangeable). For example, when the multi-state attenuator 100 is in the THROUGH state, the Ms switch is ON, the Msh switch is OFF, and the entire peak voltage of the input signal appears across the Msh shunt switch stack. For a particular fabrication process, the minimum number of FETs in the Msh shunt switch stack—the stack "size" or "height" M—is selected based only on the maximum input power expected to be withstood by the shunt section 104. As an example, for an input power of 30 dBm and for a particular CMOS fabrication process (e.g., 250 nm UltraCMOS SOS process, TiN FETs), a minimum stack size of 6 FETs for the Msh shunt switch may be suitable since the input voltage may reach about 10V. If desired for a particular application, more than the minimum number of FETs can be used per stack. Appropriately setting the stack size M of the Msh shunt switch results in good long term reliability and compression-free operation. Further, if needed, one or more of the bypass FETs (e.g., M3, M4 in FIG. 1) in the shunt section 104 may also be implemented as stacked FETs.

A useful aspect of using series-connected FETs in the shunt section 104 is that the resistances (R3, R3', R3") are additive and the IC chip area needed for implementation is less than if each signal path configuration in the throughput section 102 required a separate switchable connection to circuit ground (i.e., if parallel switched shunt circuits were used). In addition, by using a serial shunt structure, embodiments of the present invention have less leakage to ground compared to a conventional multi-state attenuator having multiple parallel shunt circuits.

Stacking of FETS for the switches in the series (with respect to the IN and OUT terminals) signal paths of the throughput section 102 may also be desirable or even necessary. For a particular fabrication process, the maximum amount of attenuation and the input power to the multi-state attenuator 100 will decide the size N of the series FET stack size in the throughput section 102, although bandwidth may be an influencing factor. For example, in one embodiment of the multi-state attenuator 100 having a maximum attenuation of 1.5 dB and an input power of 30 dBm, the voltage drop across the attenuator from IN to OUT is about 1.6V. However, for the same circuit having a maximum attenuation of 6 dB and an input power of 30 dBm, the voltage drop across the attenuator is about 5.0V, which exceeds the maximum VDS for FETs made with a particular fabrication process.

Accordingly, in order to deal with such voltages, the FET switches in one or more of the series signal paths of the throughput section 102 may need to be to be implemented as stacks of N FETs having a suitable stack size. One drawback of stacking FETs in the signal path is increased insertion loss. Thus, it is generally desirable to minimize the stack size so as to just withstand with the expected input power.

Figure 2:
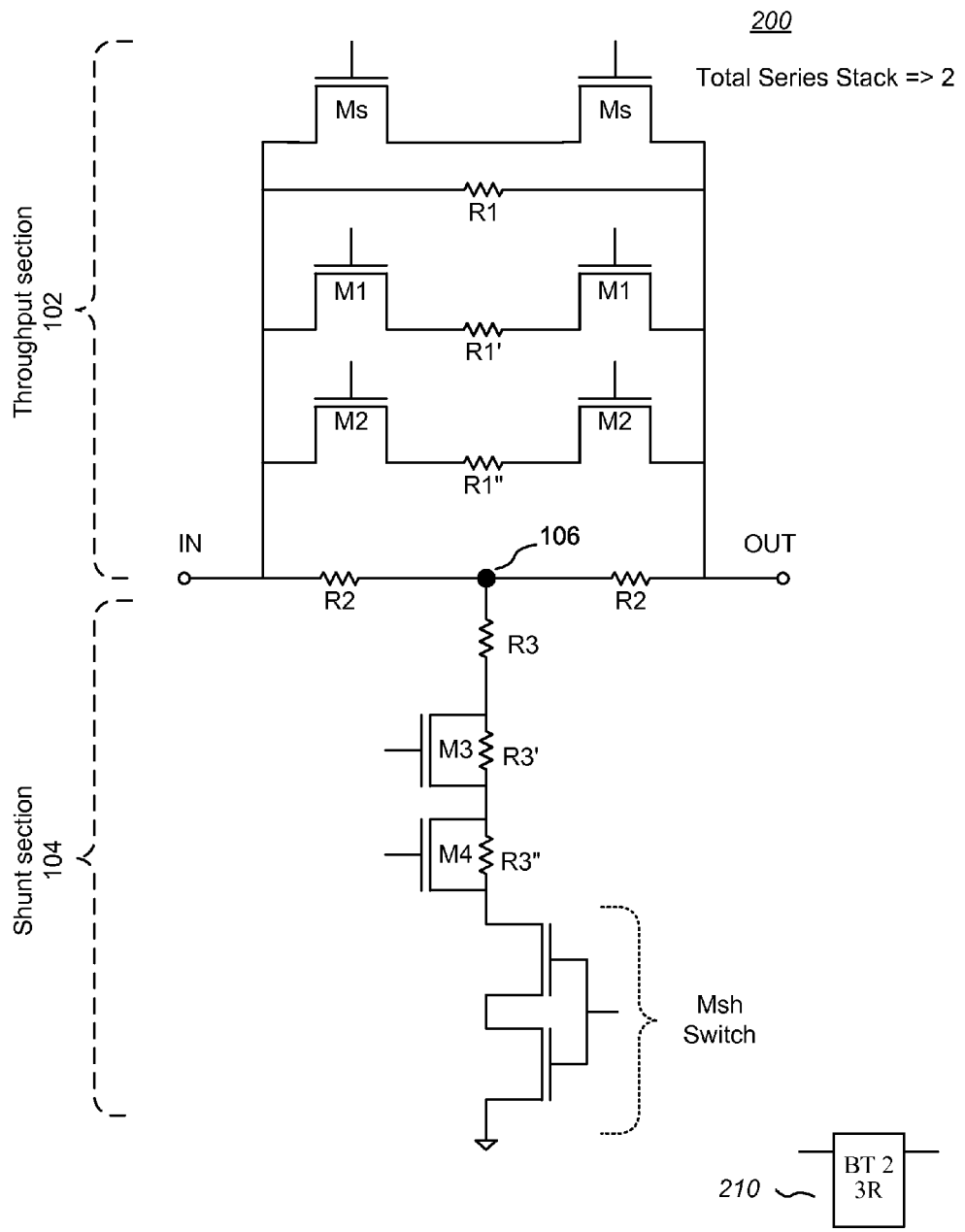
FIG. 2 is a schematic diagram of one embodiment of a bridged-T multi-state attenuator in accordance with the present invention, having a stacked FET Ms switch with a minimum stack size of two.

FIG. 2 is a schematic diagram of one embodiment of a bridged-T multi-state attenuator 200 in accordance with the present invention, having a stacked FET Ms switch with a minimum stack size of two. Thus, the single FET of the Ms switch of FIG. 1 has been replaced by two FETs, as shown, in order to withstand higher input voltages. Otherwise, operation is identical to the multi-state attenuator 100 of FIG. 1. The effective stack size of the M1 and M2 switches was already two, so no additional FETs are needed in this example for those switch elements.

The multi-state attenuator 100 of FIG. 1 can be represented symbolically by a block 110 indicating the attenuator type ("BT", for "bridged-T"), minimum series stack size ("1"), and the number of attenuation (resistance) states ("3R"). Similarly, the multi-state attenuator 200 of FIG. 2 can be represented symbolically by a block 210 indicating the same attenuator type ("BT"), a different minimum series stack size ("2"), and the same number of attenuation states ("3R").

Figure 3:
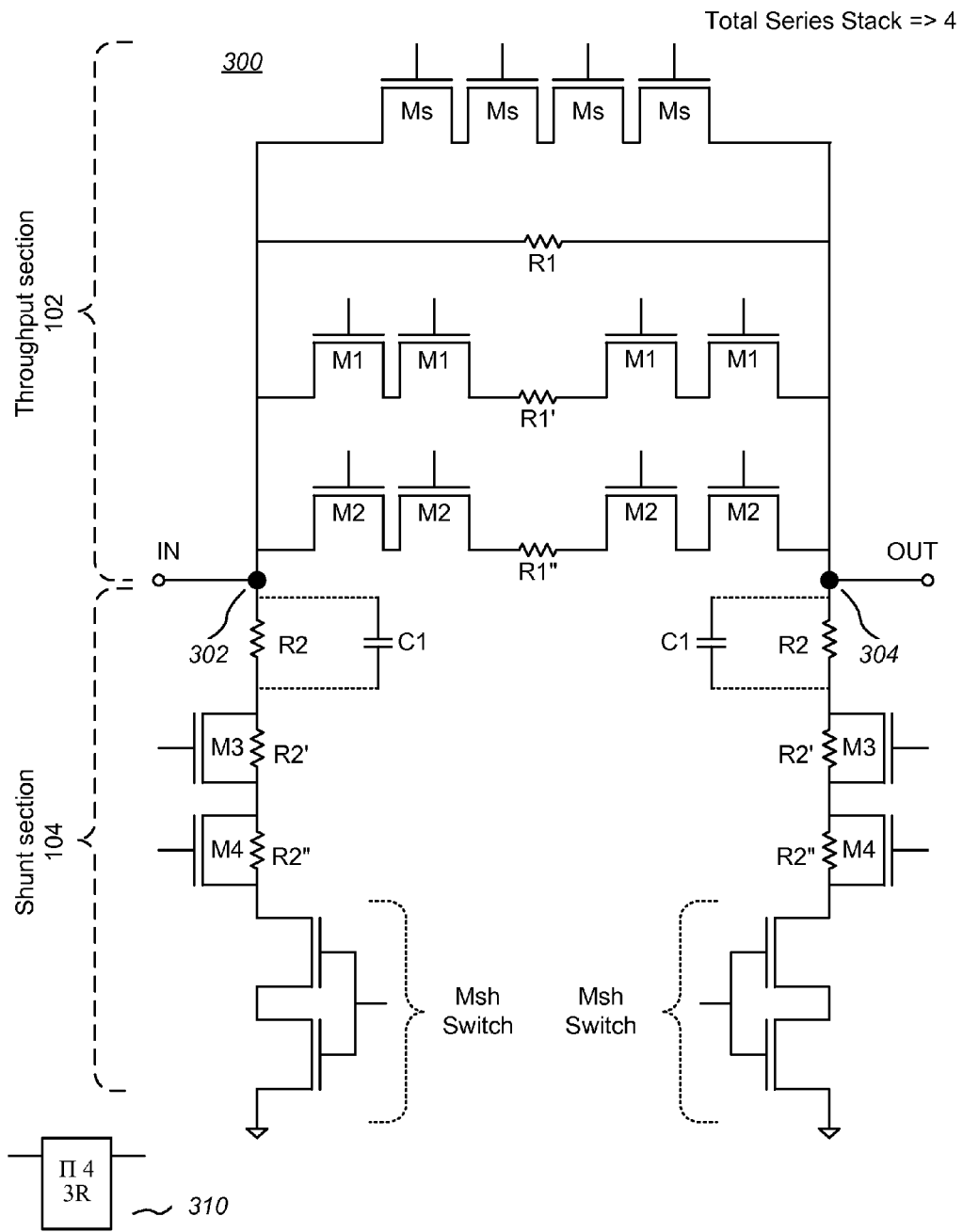
FIG. 3 is a schematic diagram of one embodiment of a pi-type (also denoted "Π-type") multi-state attenuator in accordance with the present invention, having a stacked FET Ms switch with a minimum stack size of four.

The concepts described above can be extended to other attenuator types to make multi-state attenuators with other characteristics, as described in the following sections Pi-Type Multi-State Attenuators FIG. 3 is a schematic diagram of one embodiment of a pi-type (also denoted "Π-type") multi-state attenuator 300 in accordance with the present invention, having a stacked FET Ms switch with a minimum stack size of four. In addition, in order to handle higher voltages due to having a higher maximum amount of attenuation, the illustrated circuit shows stacked M1 and M2 switches with an effective stack size of four (two FETs on each side of a respective resistor R1', R1").

The illustrated pi-type multi-state attenuator 300 is structurally similar in many regards to the bridged-T type multi-state attenuator 100 shown in FIG. 1, but differs by having a shunt section 104 with two shunt legs, one each connected to an input junction point 302 and an output junction point 304, and no always-present resistance path between the IN and OUT terminals (i.e., the R2 resistors in FIG. 1). In addition, FIG. 3 shows that optional capacitor compensation may be included to achieve a desired operational bandwidth (but possibly with some degradation of the return loss at the higher frequency band edge). In the illustrated embodiment, compensation capacitors CI are shown coupled by dotted lines in parallel with corresponding R2 resistors. If necessary, additional compensation capacitors (not shown) may be coupled in parallel with resistors R2' and R2". Such capacitor compensation may also be used in a bridged-T or a T-type multi-state attenuator.

In the example shown in FIG. 3, the throughput section 102 includes a set of resistors R1, R1', R1", and a set of switches Ms, M1, M2, coupled as shown to form four selectable parallel signal paths each serially connected between the IN terminal and the OUT terminal. By suitable setting of switches Ms, M1, M2 (see below for detail), the selectable signal paths are:
(1) through series switch Ms, bypassing R1, R1' and R1";
(2) through only R1;
(3) through only R1 and R1' (i.e., R1∥R1'); and
(4) through R1, R1', and R1" (i.e., R1∥R1'∥R1").

Thus, the resistors R1, R1', R1" may be progressively selected. Optionally, one more attenuation combination can be implemented if desired, through only R1 and R1", which would require adding a bypassable shunt resistor in the shunt section 104 to correspond with the R1∥R1" combination. In an alternative embodiment, by adding isolating switches around resistor R1, any one of the set of resistors R1, R1', R1" may be individually selected without selecting any of the other resistors, Accordingly, all combinations of such resistors would be available, which would provide one through state and 7 attenuation states: R1, R1', R1", (R1∥R1'), (R1∥R1"), (R1'∥R1") and (R1∥R1' ∥R1"). In such a case, the shunt section 104 would have to be modified to provide a selectable corresponding matching impedance for each of the 7 states.

Operationally, the pi-type multi-state attenuator 300 behaves very similarly to the bridged-T type multi-state attenuator 100 shown in FIG. 1 in terms of state selection. TABLE 2 summarizes the switch settings for the four selectable states of the embodiment shown in FIG. 3 ("0" means OFF, "1" means ON, and "x" means "don't care"):

TABLE 2

| Through State/ Attenuation State | Ms | Msh | M1 | M2 | M3 | M4 |
|---|---|---|---|---|---|---|
| A0 | 1 | 0 | x | x | x | x |
| A1 | 0 | 1 | 0 | 0 | 1 | 1 |
| A2 | 0 | 1 | 1 | 0 | 0 | 1 |
| A3 | 0 | 1 | 1 | 1 | 0 | 0 |

In the illustrated embodiment, attenuation state A1 provides the most amount of attenuation, since attenuation states A2 and A3 progressively add parallel resistors in the throughput section 102, thus lowering the total resistance of the parallel signal paths. Example values for the attenuation states may be A1=24 dB, A2=16 dB, and A3=8 dB. Concurrently, series resistors are added in the shunt section 104 for impedance matching purposes. The values of the throughput section 102 resistors R1, R1', R1" and of the shunt section 104 impedance matching resistors R2, R2', R2" are selected to achieve a particular desired amount of attenuation per attenuation state with proper impedance matching, and can be readily determined by computation, simulation, or by conventional experimentation.

The multi-state attenuator 300 of FIG. 3 can be represented symbolically by a block 310 indicating the attenuator type ("Π" or "pi"), minimum series stack size ("4"), and the number of attenuation (resistance) states ("3R").

Figure 4:
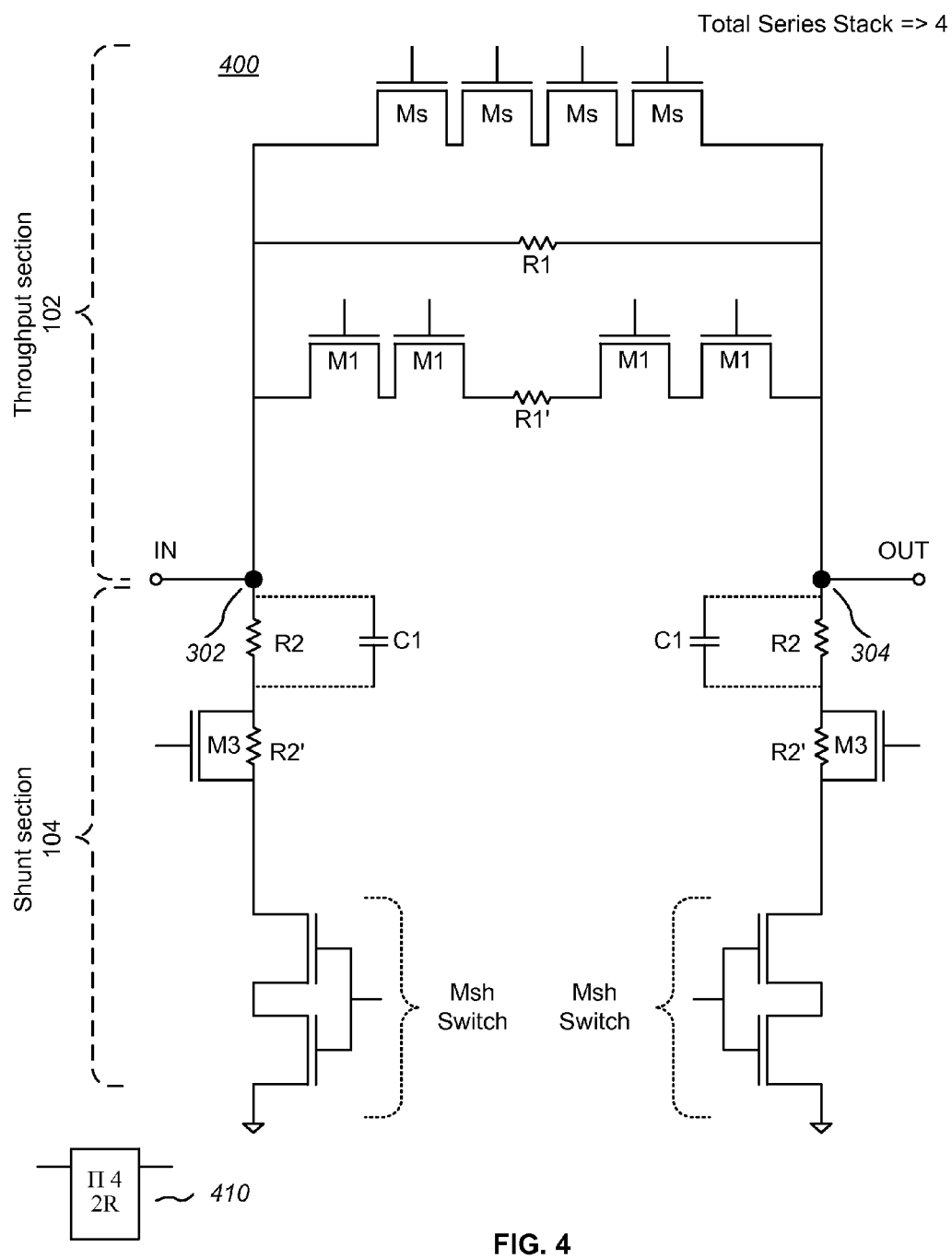
FIG. 4 is a schematic diagram of one embodiment of a pi-type multi-state attenuator in accordance with the present invention, having a stacked FET Ms switch with a minimum stack size of four.

FIG. 4 is a schematic diagram of one embodiment of a pi-type multi-state attenuator 400 in accordance with the present invention, having a stacked FET Ms switch with a minimum stack size of four. The illustrated attenuator has only three selectable signal paths:
(1) through series switch Ms, bypassing R1 and R1;
(2) through only R1; and
(3) through only R1 and R1'.

Operationally, the illustrated pi-type multi-state attenuator 400 behaves very similarly to the pi-type multi-state attenuator 300 shown in FIG. 3. TABLE 3 summarizes the switch settings for the three selectable states of the embodiment shown in FIG. 4 ("0" means OFF, "1" means ON, and "x" means "don't care"):

TABLE 3

| Through State/Attenuation State | Ms | Msh | M1 | M3 |
|---|---|---|---|---|
| A0 | 1 | 0 | x | x |
| A1 | 0 | 1 | 0 | 1 |
| A2 | 0 | 1 | 1 | 0 |

The multi-state attenuator 400 of FIG. 4 can be represented symbolically by a block 410 indicating the attenuator type ("Π" or "pi"), minimum series stack size ("4"), and the number of attenuation (resistance) states ("2R").

T-Type Multi-State Attenuators

Figure 5:
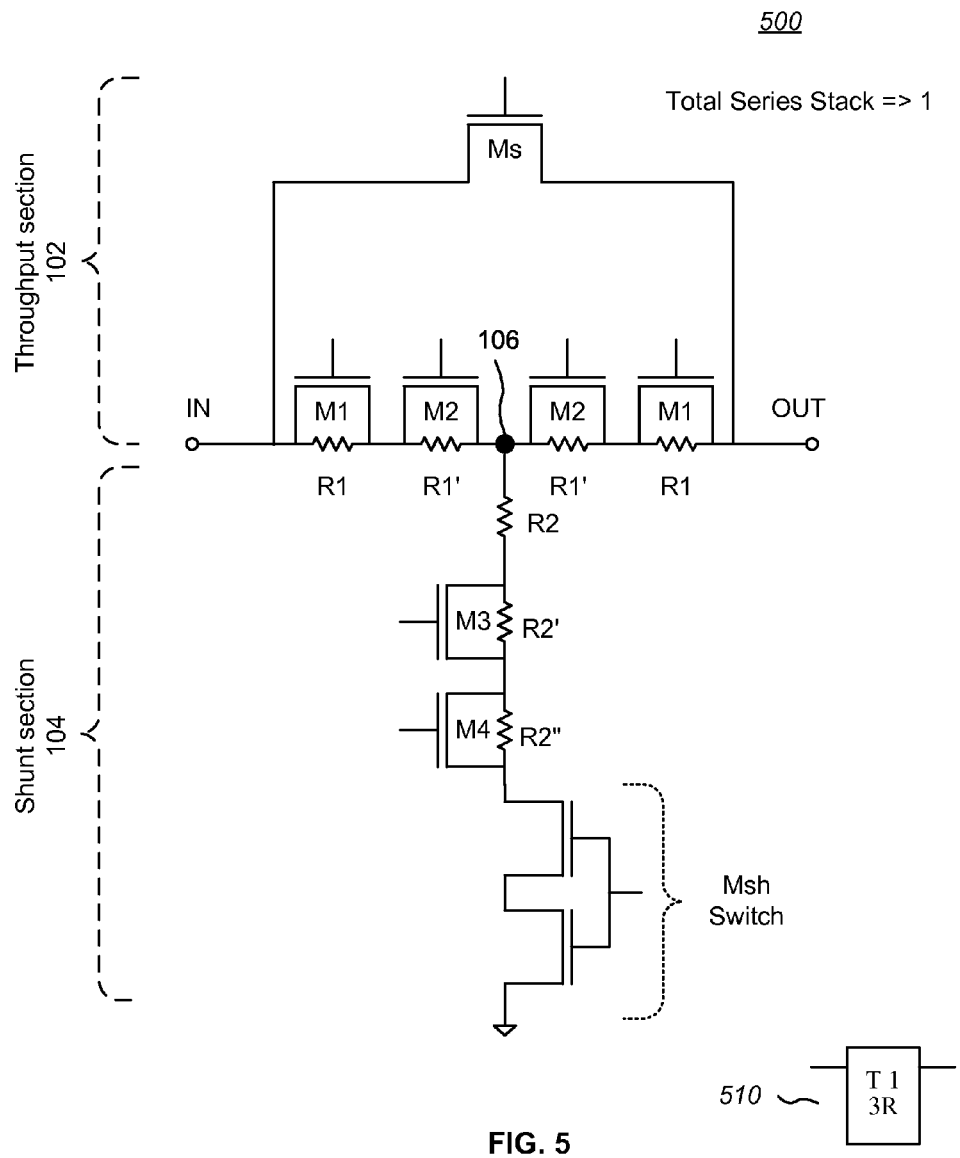
FIG. 5 is a schematic diagram of one embodiment of a T-type multi-state attenuator in accordance with the present invention.

FIG. 5 is a schematic diagram of one embodiment of a T-type multi-state attenuator 500 in accordance with the present invention. Various configurations for the resistance elements in the throughput section 102 may be used; in this embodiment, the illustrated multi-state attenuator 500 has a set of bypassable series resistance elements and an overall bypass element that allow four selectable signal paths:
(1) through series switch Ms, bypassing R1 and R1' (i.e., no attenuation);
(2) through R1, bypassing R1;
(3) through R1', bypassing R1; and
(4) through R1 and R1'.

The shunt resistors R2, R2', R2" (with any corresponding bypass switches) in the shunt section 104 can be in any physical order because they are series connected. Similarly, the series-connected signal path resistors R1, R1' in the throughput section 102 can be in any physical order.

One notable difference in operation from the bridged-T multi-state attenuator 100 of FIG. 1 is that the highest level of attenuation for the multi-state attenuator 500 is when both R1 and R1' are in-circuit. One possible disadvantage of a multi-state T-type attenuator is that the effect of the varying amounts of series resistance on signal loss; nevertheless, such a configuration may be useful in some applications.

TABLE 4 summarizes the switch settings for the four selectable states of the multi-state attenuator 500 embodiment shown in FIG. 5 ("0" means OFF, "1" means ON, and "x" means "don't care"):

TABLE 4

| Through State/Attenuation State | Ms | Msh | M1 | M2 | M3 | M4 |
|---|---|---|---|---|---|---|
| A0 | 1 | 0 | x | x | x | x |
| A1 | 0 | 1 | 0 | 1 | 1 | 1 |
| A2 | 0 | 1 | 1 | 0 | 0 | 1 |
| A3 | 0 | 1 | 0 | 0 | 0 | 0 |

The multi-state attenuator 500 of FIG. 5 can be represented symbolically by a block 510 indicating the attenuator type ("T"), minimum series stack size ("1"), and the number of attenuation (resistance) states ("3R").

For the multi-state attenuators shown in FIGS. 3, 4 and 5, it is convenient to select resistor values so that the attenuation states have a progressive attenuation relationship (e.g., 8 dB, 16 dB, and 24 dB for the multi-state attenuator 300, and 8 dB and 16 dB for the multi-state attenuator 400).

L-Pad Type Multi-State Attenuators

Figure 6:
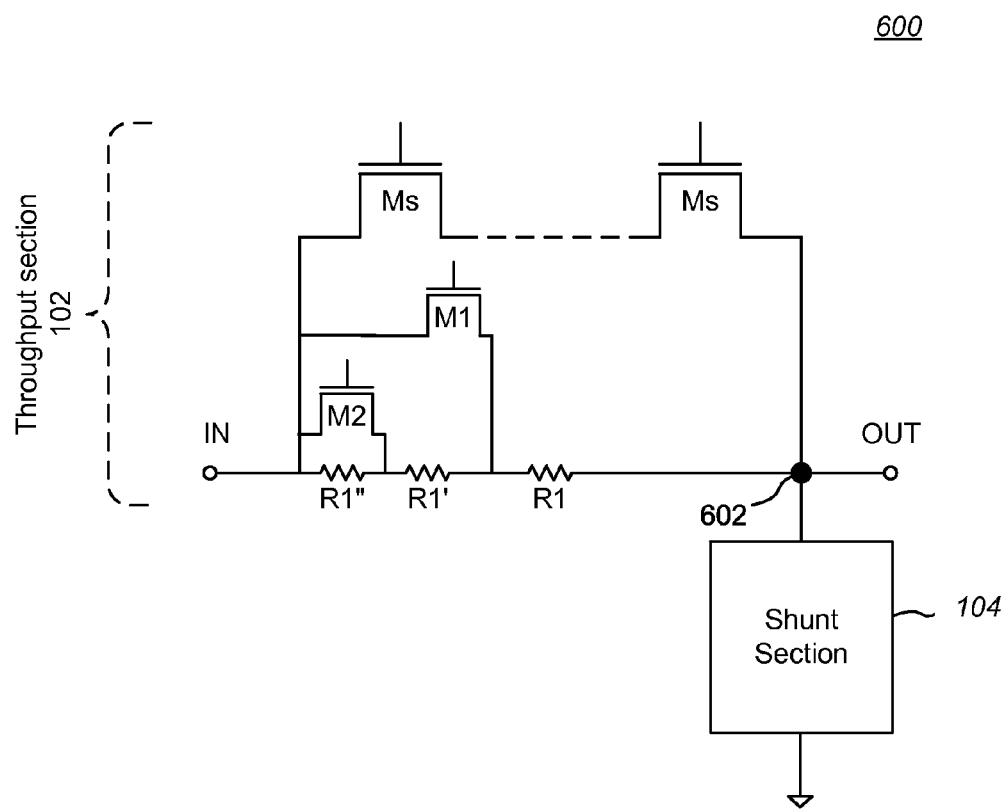
FIG. 6 is a schematic diagram of one embodiment of an L-pad type multi-state attenuator in accordance with the present invention.

FIG. 6 is a schematic diagram of one embodiment of an L-pad type multi-state attenuator 600 in accordance with the present invention. An L-pad attenuator may be used to match the impedances of unbalanced source and load networks, and looks very much like a T-type attenuator with only one-half of the throughput section resistance elements present. Various configurations for the resistance elements in the throughput section 102 may be used; in the illustrated embodiment, the multi-state attenuator 600 has a tiered bypassable series resistance element configuration and an overall bypass element that allows four selectable signal paths:
(1) through series switch Ms, bypassing R1, RP, and R1" (i.e., no attenuation);
(2) through R1, bypassing R1' and R1";
(3) through R1 and R1', bypassing R1"; and
(4) through R1, R1', and R1".

The shunt section 104, coupled to the throughput section 102 at node 602, would include corresponding matching impedances for each state, similar to the shunt section of FIG. 5. TABLE 5 summarizes the switch settings for the four selectable states of the L-pad type multi-state attenuator 600 embodiment shown in FIG. 6 ("0" means OFF, "1" means ON, and "x" means "don't care"):

TABLE 5

| Through State/Attenuation State | Ms | M1 | M2 | In-Circuit Resistance |
|---|---|---|---|---|
| A0 | 1 | x | x | none |
| A1 | 0 | 1 | 1 | R1 |
| A2 | 0 | 1 | 0 | R1' + R1 |
| A3 | 0 | 0 | 0 | R1" + R1' + R1 |

Alternative Embodiments

The inventive concepts described above can be applied in a number of ways to various alternative embodiments. For example, the throughput section 102 can be implemented with various combinations of series and/or parallel switched or bypassable resistances such that two or more resistance states can be programmatically selected. Similarly, the series shunt section 104 can be augmented with various combinations of series and/or parallel switched or bypassable resistances such that two or more resistance states can be programmatically selected.

Figure 7:
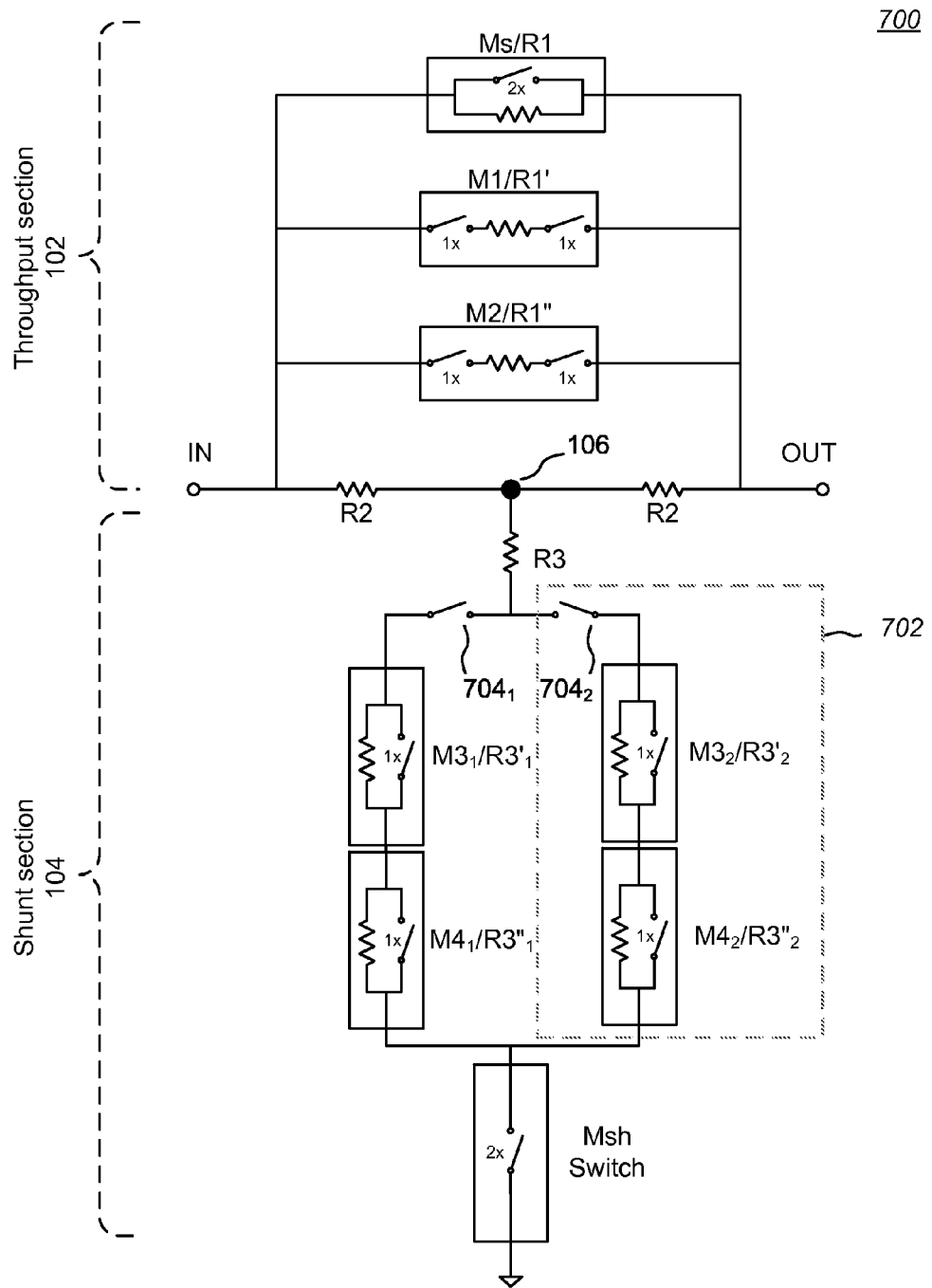
FIG. 7 is a schematic diagram of one alternative embodiment of a bridged-T multi-state attenuator in accordance with the present invention, having a partially-parallel series shunt section.

FIG. 7 is a schematic diagram of one alternative embodiment of a bridged-T multi-state attenuator 700 in accordance with the present invention, having a partially-parallel/partially series shunt section 104. The illustrated circuit is essentially the same as the circuit shown in FIG. 2, with simplified symbols replacing the comparable bypassable circuit elements (e.g., Ms/R1) and the selectable series elements (e.g., M1/R1'), where the "Nx" notation in the symbols indicates the number of switches N in a stack of FETs. However, in the multi-state attenuator 700 of FIG. 7, the original bypassable series-connected shunt elements (M3/R3' and M4/R3" in FIG. 2, relabeled as $M3_1/R3'_1$ and $M4_1/R3''_1$ in FIG. 7) have been augmented with a parallel set 702 of bypassable series-connected shunt elements $M3_2/R3'_2$ and $M4_2/R3''_2$ that, in conjunction with appropriate settings of corresponding switches $704_1, 704_2$, provide alternative matching impedances by allowing additional resistances to be placed in parallel with the original shunt resistances. In a variation, the Msh switch may be replicated for the parallel set 702 of bypassable shunt elements so that two completely separate but parallel multiple-resistance element series-connected shunt paths may be selected.

Figure 8:
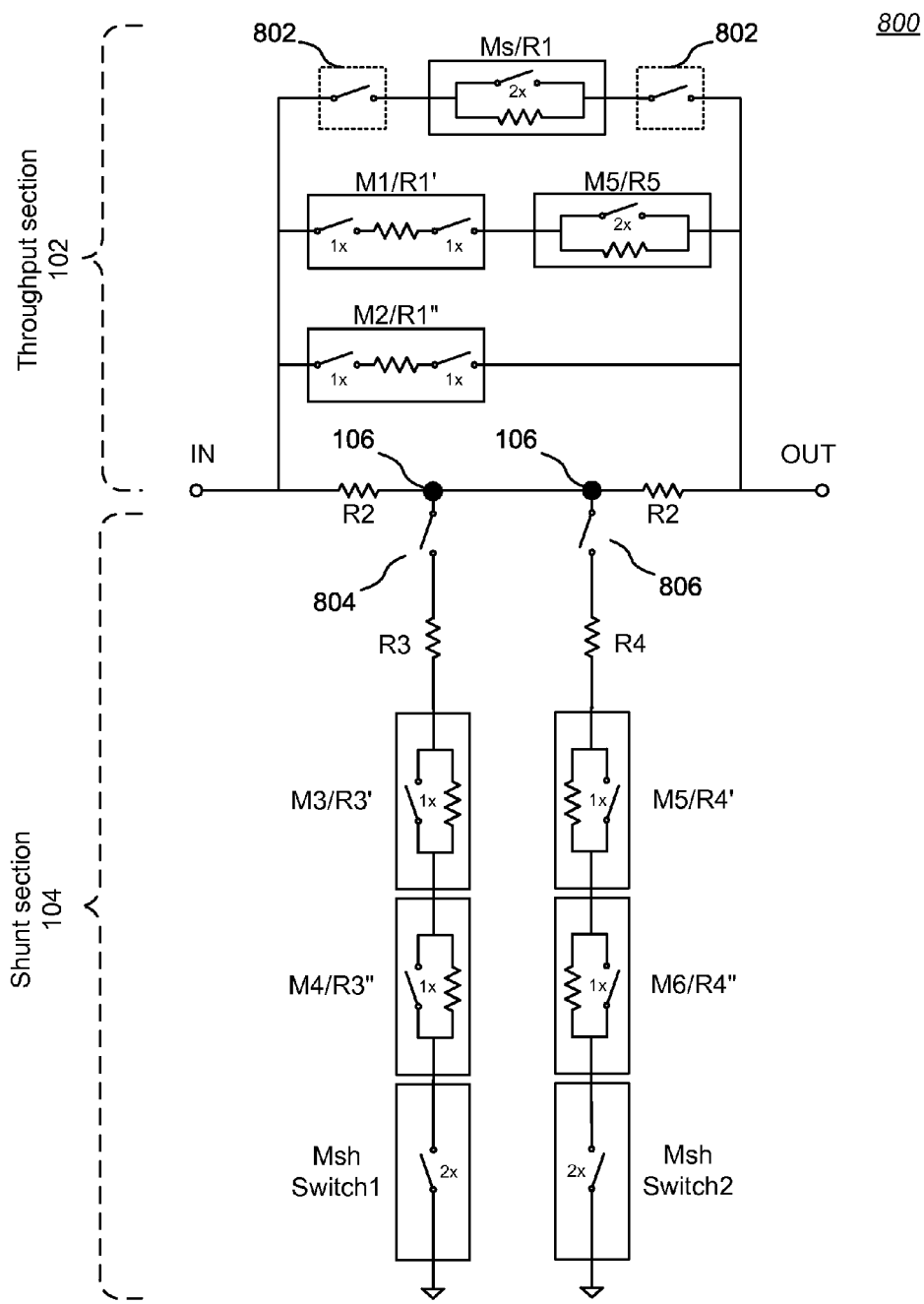
FIG. 8 is a schematic diagram of another alternative embodiment of a bridged-T multi-state attenuator in accordance with the present invention, having an augmented series resistance element.

FIG. 8 is a schematic diagram of another alternative embodiment of a bridged-T multi-state attenuator 800 in accordance with the present invention, having an augmented series resistance element. The illustrated circuit is essentially the same as the circuit shown in FIG. 2, again with simplified symbols replacing the comparable circuit elements of FIG. 2. However, in the embodiment of FIG. 8, the M1/R1' series circuit element has been augmented with a bypassable series resistance element M5/R5, which may be selectively switched into or out of circuit. A similar bypassable series resistance element may also be positioned on the other side of the M1/R1' series circuit element in order to maintain a symmetrical layout on an integrated circuit. In addition, the same type of augmentation can be done for the M2/R1" series circuit element if desired. One advantage of the ability to add series resistance augmentation is that the parallel series elements (M1/R1' and M2/R1") can be used for coarse changes in total attenuation, while the augmenting series resistance element (e.g., M5/R5) can be used for fine tuning the level of total attenuation (a concept also applicable to the shunt section 104). In a variation, a pair of optional switches 802 may be added to bracket the bypassable series resistance element Ms/R1, thus providing more combinations of resistance elements since the Ms/R1 element can be switched completely out of circuit.

FIG. 8 also shows that the shunt section 104 can be configured with parallel series shunt paths through R3 and R4, respectively, either or both of which can be switched into circuit through a corresponding switch 804, 806; of course, more than two parallel series shunt paths may be used. The same type of parallel series shunt path configuration may be also used in conjunction with the pi-type, T-type, and L-pad type multi-state attenuators described above. One advantage of such a configuration is that coarse adjustments to matching impedances can be accomplished by switching the parallel legs into or out of circuit, while fine adjustment can be performed by switching the series resistance elements into or out of circuit.

Figure 9:
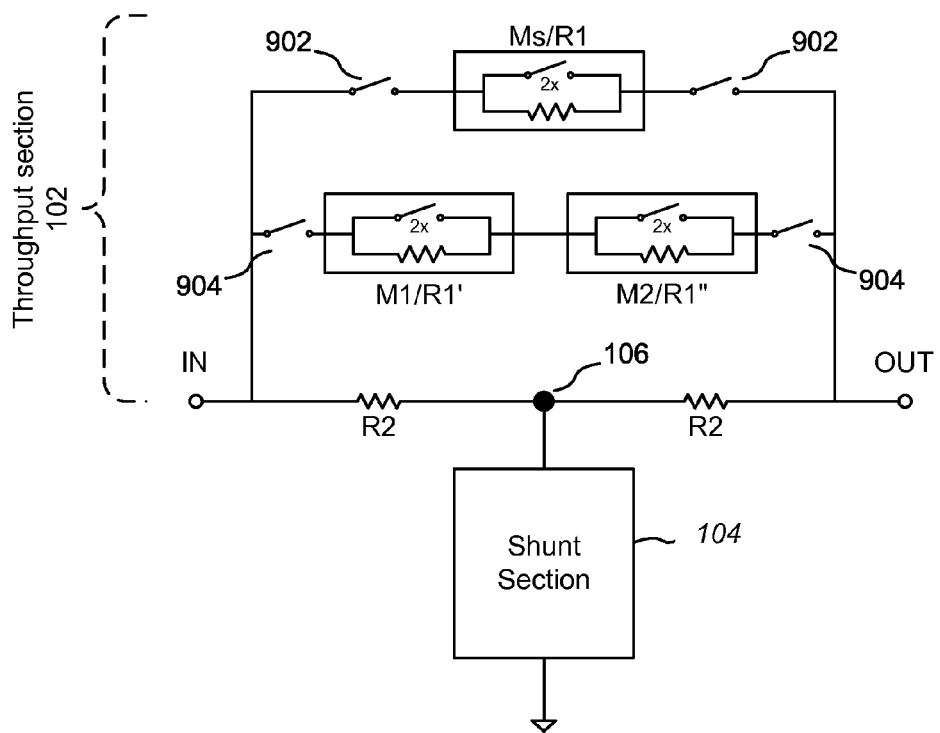
FIG. 9 is a schematic diagram of another alternative embodiment of a throughput section for a bridged-T multi-state attenuator in accordance with the present invention, having a parallel-series resistance element configuration.

FIG. 9 is a schematic diagram of another alternative embodiment of a throughput section 102 for a bridged-T multi-state attenuator 900 in accordance with the present invention, having a parallel-series resistance element configuration. Pairs of switches 902, 904 respectively bracket a bypassable series resistance element Ms/R1 and the two bypassable series resistance elements M1/R1', M2/R1". In this example, the bypassable series resistance element Ms/R1 and the two bypassable series resistance elements M1/R1', M2/R1" may be selectively switched into circuit or bypassed to give a desired level of attenuation (e.g., R1, R1', R1", R1||R1', R1||R1", R1'+R1", and R1||(R1'+R1")). As should be clear, more than two bypassable series resistance elements may be used. Further, the Ms/R1 element can be omitted to create a purely series configuration for the throughput signal paths in yet another alternative embodiment, since a bypass path (for no attenuation) can be achieved by concurrently setting the switches of both of the M1/R1' and M2/R1" elements to ON, and R1' and R1" can be inserted into circuit individually or in series, thus forming a third resistance value.

Figure 10:
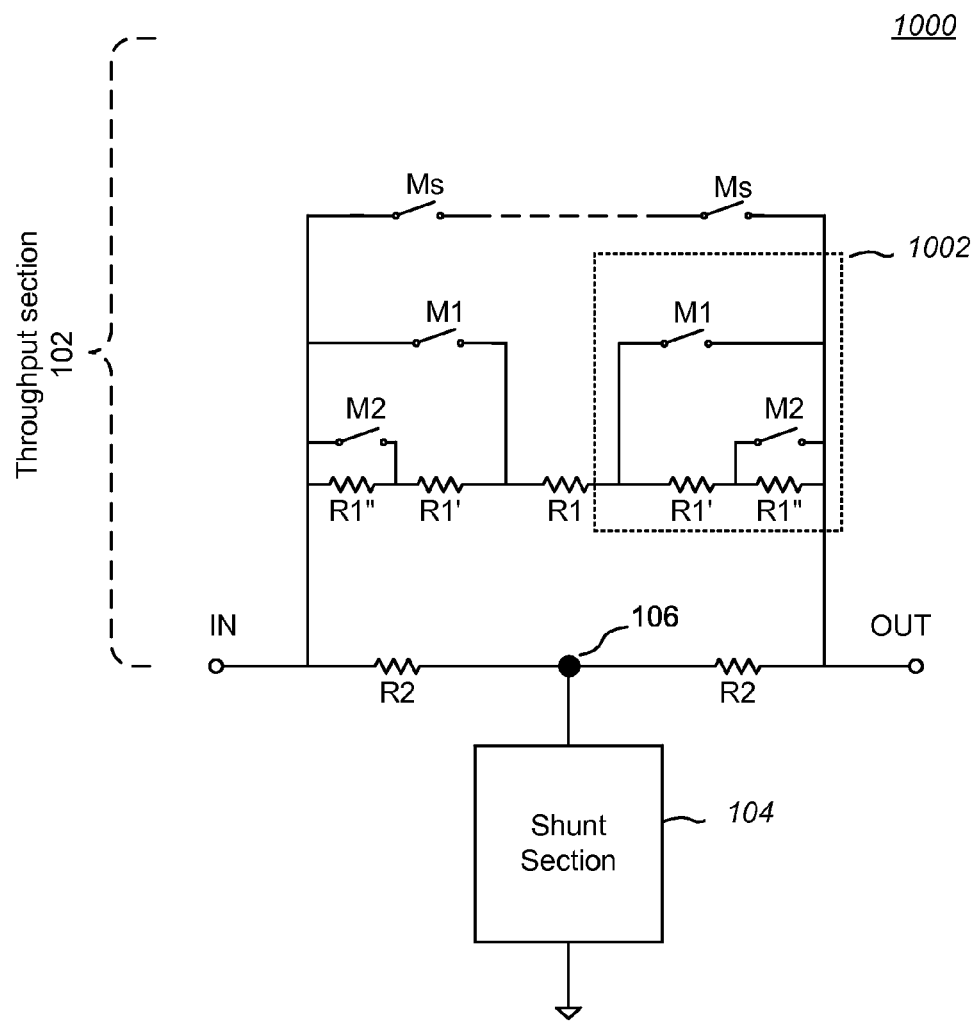
FIG. 10 is a schematic diagram of another alternative embodiment of a throughput section for a bridged-T multi-state attenuator in accordance with the present invention, having a tiered bypassable series resistance element configuration.

FIG. 10 is a schematic diagram of another alternative embodiment of a throughput section 102 for a bridged-T multi-state attenuator 1000 in accordance with the present invention, having a tiered bypassable series resistance element configuration. TABLE 6 shows the various selectable states (ignoring for simplicity the corresponding states of the switches in the shunt section 104; "0" means OFF, "1" means ON, and "x" means "don't care"):

TABLE 6

| Through State/<br>Attenuation State | Ms | M1 | M2 | In-Circuit<br>Resistance |
|---|---|---|---|---|
| A0 | 1 | x | x | none |
| A1 | 0 | 1 | 1 | R1 |
| A2 | 0 | 0 | 1 | R1' + RI + RP |
| A3 | 0 | 0 | 0 | R1" + R1' + R1 + R1' + R1" |

The embodiment shown in FIG. 10 shows symmetrical R1' and R1" resistor pairs, which may have some advantages in laying out a circuit by avoiding parasitical interactions caused by asymmetrical layouts. However, if the values of R1' and R1" are very small, then excluding one resistor of each pair along with the associated FET switches M1, M2 (i.e., the elements bounded by box 1002) may provide better performance because the "extra" switches in a symmetrical or "two sided" configuration will add more RON values to the circuit compared to a "one sided" configuration.

Figure 11:
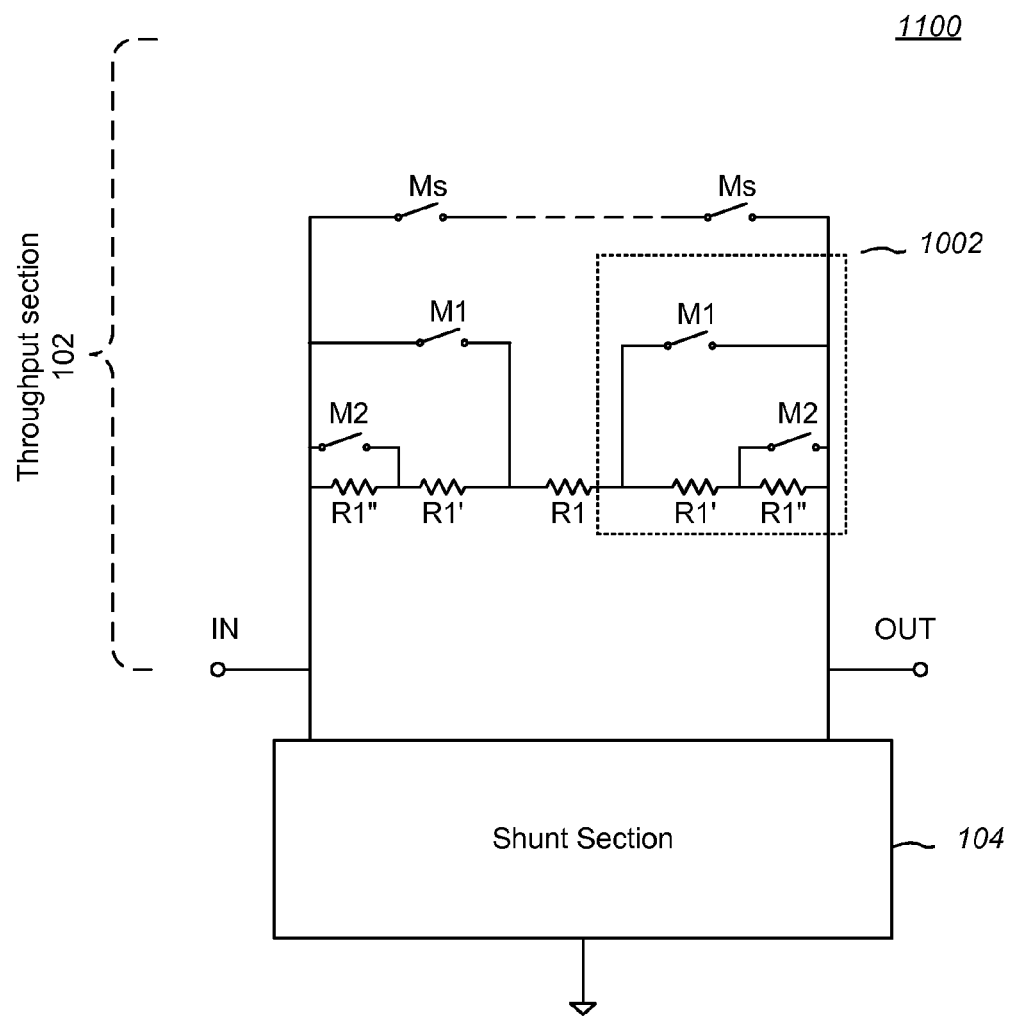
FIG. 11 is a schematic diagram of an alternative embodiment of a throughput section for a pi-type multi-state attenuator in accordance with the present invention, having a tiered bypassable series resistance element configuration.

The tiered bypassable series resistance element configuration of FIG. 6 (for an L-pad multi-state attenuator) and FIG. 10 (for a bridged-T multi-state attenuator) can be extended to pi-type and T-type multi-state attenuators as well. For example, FIG. 11 is a schematic diagram of an alternative embodiment of a throughput section 102 for a pi-type multi-state attenuator 1100 in accordance with the present invention, having a tiered bypassable series resistance element configuration. As in FIG. 10, in some cases, the symmetrical set of R1' and R1" resistances within the bounding box 1002 may be omitted.

Figure 12:
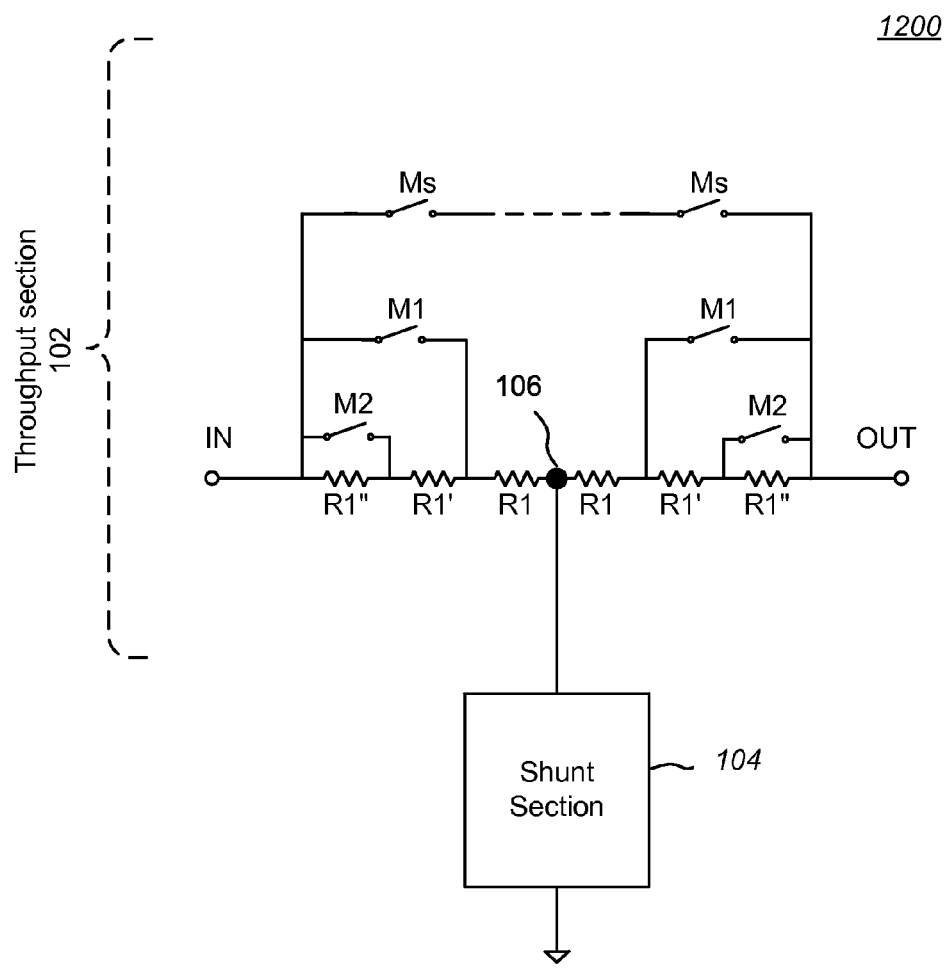
FIG. 12 is a schematic diagram of an alternative embodiment of a throughput section for a T-type multi-state attenuator in accordance with the present invention, having a tiered bypassable series resistance element configuration.

Similarly, FIG. 12 is a schematic diagram of an alternative embodiment of a throughput section for a T-type multi-state attenuator 1200 in accordance with the present invention, having a tiered bypassable series resistance element configuration. In this case, the symmetrical set of R1, R1', and R1" resistances is necessary so that both the IN and OUT ports present the same impedance.

The tiered bypassable series resistance element configuration provides for higher attenuation as more and more resistors are switched into the circuit by turning the corresponding FET switches OFF. As more resistors are switched into the circuit for higher attenuation, the more surface area on an integrated circuit is added, thus improving power dissipation for the circuit as a whole.

A tiered bypassable series resistance element configuration can also be used for the shunt section 104 of any of the multi-state attenuator types described above. Doing so may help improve the bandwidth of a multi-state attenuator because switching in more resistors in the circuitry adds more COFF (i.e., the OFF capacitance of the FETs) in parallel to such resistances, which will provide higher attenuation versus frequency. Normally, a circuit designer wants slightly more attenuation with frequency because the insertion loss of an attenuator in the OFF state also increases with frequency; accordingly, the designer generally would like the two states to have the same slope as a function of frequency.

Figure 13:
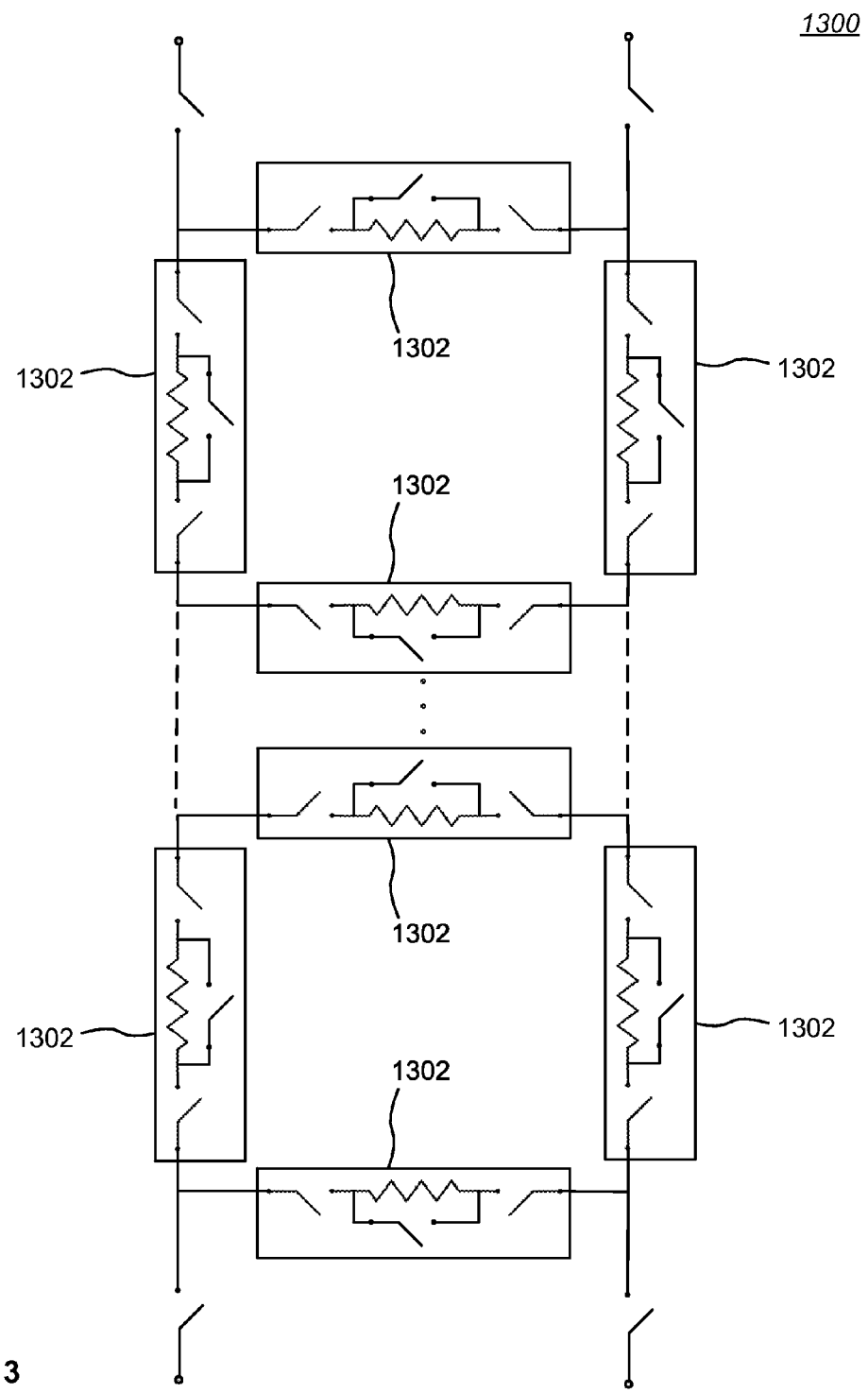
FIG. 13 is a schematic diagram showing a "mesh" or "matrix" configuration of selectable bypassable resistance elements.

As one more example of the flexibility of the invention, FIG. 13 is a schematic diagram showing a "mesh" or "matrix" configuration 1300 of selectable bypassable resistance elements 1302. As should be clear from the depicted symbols, each bypassable resistance element 1302 may be switched completely out of circuit (i.e., an open circuit), or, when switched into circuit, configured as a resistance or as a bypass path (i.e., a short circuit). The resistance elements 1302 can be programmed with component coupled in series, in parallel, in series-parallel, in parallel-series, or any combination of the above. Thus, depending upon on the required value of attenuation, the equivalent resistance can be achieved by selection of component elements from the matrix of resistance elements 1302 (with due regard for parasitic effects, particularly with respect to bandwidth).

Various configurations of the throughput section 102 and the shunt section 104 can be implemented for bridged-T, pi-type, T-type, and L-pad type multi-state attenuators, and variants of such circuits. More generally, the inventive concepts described above encompass various combinations of parallel and serial fixed or selectable resistances in a multi-state attenuator such that multiple resistance states and impedance matching states can be programmatically selected, and may include stacked switch elements to withstand applied voltages to a specified design level. FIGS. 15*a-e* are simplified schematic diagrams of various resistor and switch combinations that are useful in conjunction with various embodiments of the present invention (symbol type B represents a compact representation of a bypassable resistance element, while symbol type S represents a compact representation of a serially-switchable resistance element; optional elements are shown in a dashed bounding box or with dashed connection lines).

Figure 15A:
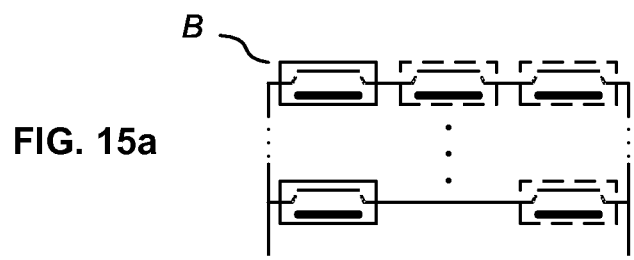
FIGS. 15a-e are simplified schematic diagrams of various resistor and switch combinations that are useful in conjunction with various embodiments of the present invention.
Figure 15B:
Figure 15C:
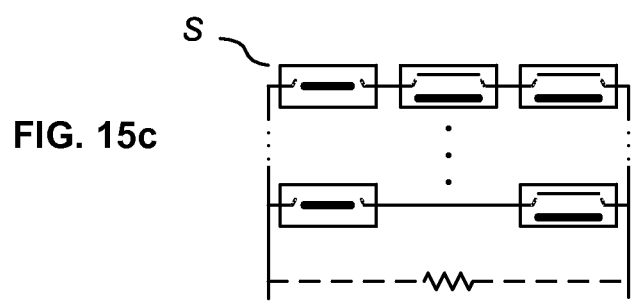
Figure 15D:
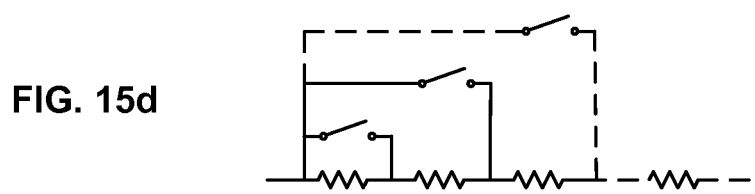
Figure 15E:
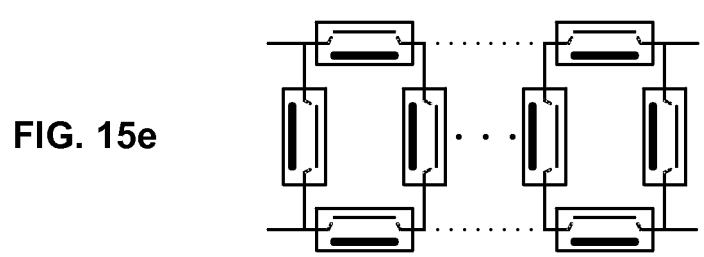

Thus, the throughput section 102 may include (without limitation) at least the following configurations, in which any resistive element may be an individual switch or concurrently controlled stacked switches:
  parallel sets of individually selectable series resistances (e.g., M1/R1' and M2/R1" in FIG. 1, and the configuration in FIG. 15*a* with or without the optional elements);
  a set of series-connected selectable resistances, with or without a bypassable resistive element (e.g., M1/R1' and M2/R1" in FIG. 7, with or without Ms/R1, and the configuration in FIG. 15*b*);
  parallel sets of selectable series resistances, some of which may have plural series-connected selectable and bypassable augmenting resistances (e.g., the throughput section 102 of FIG. 8, and the configuration in FIG. 15*c*);
  tiered bypassable series resistances (e.g., the throughput section 102 of FIG. 10, and the configuration in FIG. 15*d*); and
  mesh or matrix resistance elements (e.g., as shown in FIG. 13, and the configuration in FIG. 15*e*).

Similarly, the shunt section 104 may include (without limitation) at least the following configurations, in which any resistive element may be an individual switch or concurrently controlled stacked switches:
  a stacked main shunt switch (e.g., Msh in FIG. 1 or FIG. 3) in series with one or more series-connected bypassable resistances, and optionally in series with at least one fixed resistance (e.g., the shunt section 104 of FIG. 1 or FIG. 3);
  a stacked main shunt switch in series with one or more parallel sets of series-connected bypassable resistances, and optionally in series with at least one fixed resistance (e.g., the partially-parallel series shunt section 104 of FIG. 7); and
  at least two stacked main shunt switches each in series with one or more sets of series and/or parallel and/or series-parallel connected bypassable resistances, and optionally in series with at least one corresponding fixed resistance (e.g., the variant parallel-series shunt section 104 described above for the circuit shown in FIG. 7, and the parallel series shunt section shown in FIG. 8).

Any of the resistance elements or sets of resistance elements may be of the matrix type shown in FIG. 13. Further, the inventive concepts can even be extended to multiple parallel shunt circuits of the type described in the '323 patent discussed above by configuring some of the series shunt switches as stacked FETs and/or by configuring the selectable signal paths with stacked FETs, in order to achieve a desired voltage handling capability.

As noted above, for all such multi-state attenuator configurations, in order to deal with specified voltage levels, the FET switches in one or more of the signal paths of the throughput section 102 may need to be to be implemented as stacks of FETs having a suitable stack size. Examples of minimum stack sizing for a particular CMOS fabrication process and an input power of 30 dbm are shown in TABLE 7:

TABLE 7

| Attenuator Type | Maximum Attenuation (dB) | Voltage drop across Attenuator | Stack Size | Vgs_MAX (V) | Vds_MAX (V) |
|---|---|---|---|---|---|
| T | 1.5 | 1.6 | 1 | 4.2 | 1.6 |
| T | 6.0 | 5.0 | 2 | 4.6 | 2.5 |
| Pi | 16.0 | 8.4 | 4 | 4.5 | 2.1 |
| Pi | 24.0 | 9.4 | 4 | 4.6 | 2.3 |

Variable Type Multi-State Attenuators

Figure 14:
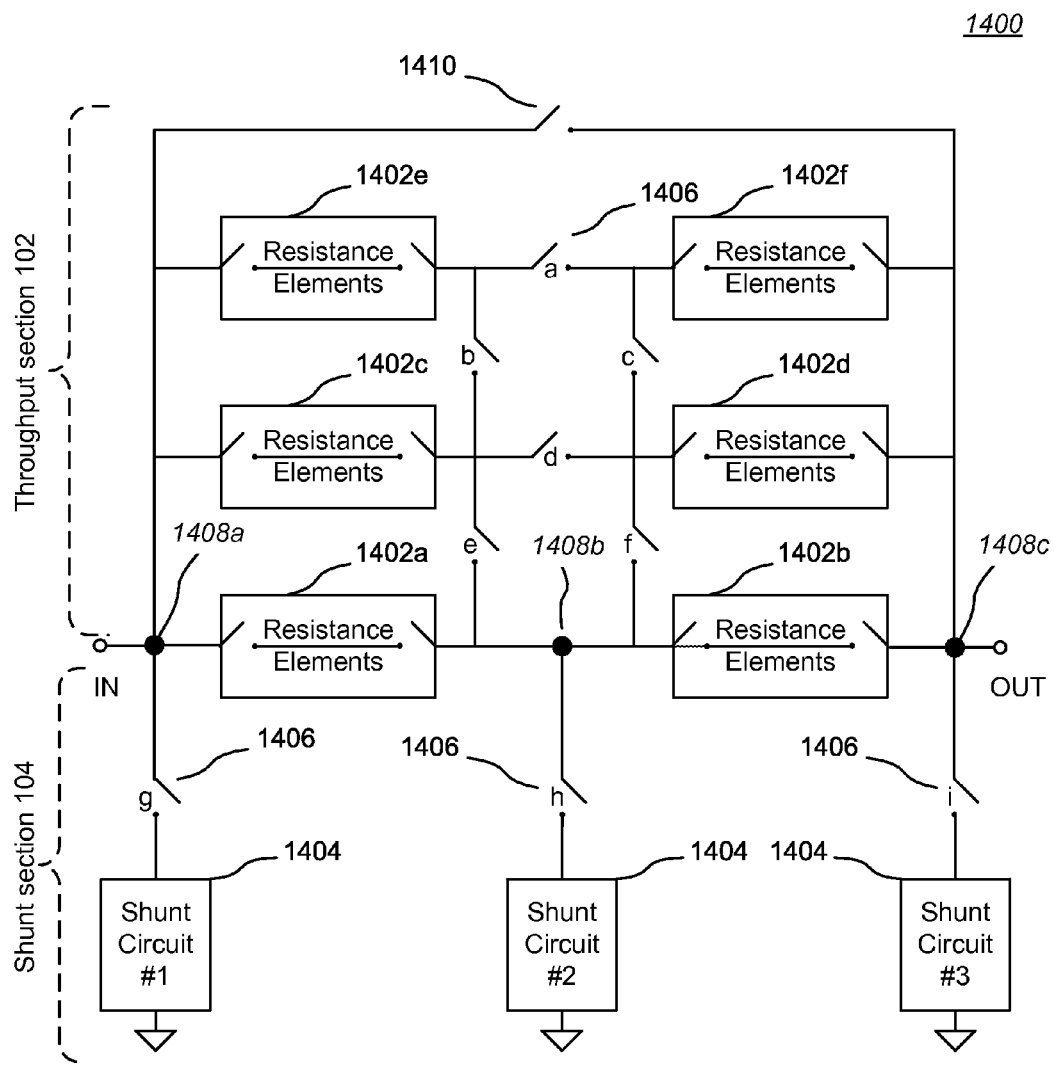
FIG. 14 is schematic diagram of one embodiment of a variable-type multi-state attenuator in accordance with the present invention.

Another aspect of the invention is the combination of parallel and/or serial fixed and/or selectable resistances along with configuration selection switches to create a multifunctional variable-type (e.g., bridged-T type, pi-type, T-type, and/or L-pad type) multi-state attenuator. FIG. 14 is schematic diagram of one embodiment of a variable-type multi-state attenuator 1400 in accordance with the present invention. A plurality of resistance elements 1402*a-f* in a throughout section 102 are selectable connectable (e.g., by internal switches) to one or more of three shunt circuits 1404*a-c* through a network of configuration switches 1406*a-i* (not all have the prefix "1406" due to space constraints). The multi-state attenuator 400 would include at least two rows of resistance elements 1402*a-f*; three rows are shown by way of example. The resistance elements 1402*a-f* need not all be identical, and each may include one or more switchable resistances and/or bypassable resistances. Any one resistance element 1402*a-f* may be switched into or out of circuit and/or bypassed.

In addition, any of the three shunt sections 1404*a-c* may be coupled to corresponding nodes 1408*a-c* of the throughout section 102: an IN port node 1408*a*, an intermediate node 1408*b*, and an OUT port node 1408*c*. A bypass switch 1410 allows the entire multi-state attenuator 1400 to be bypassed.

By selective activation of the configuration switches 1406*a-i*, the illustrated embodiment can be programmatically configured as any of a bridged-T type, pi-type, T-type, or L-pad type multi-state attenuator; examples of each are shown in TABLE 8:

TABLE 8

| Attenuator Type | Closed Switches 1406 | Open Switches 1406 | Engaged Shunts |
|---|---|---|---|
| Pi | a, d, g, i | b, c, e, f, h | 1 & 3 |
| Bridged-T* | a, d, h | b, c, e, f, g, i | 2 |

TABLE 8-continued

| Attenuator Type | Closed Switches 1406 | Open Switches 1406 | Engaged Shunts |
|---|---|---|---|
| L-Pad | a, d, i | b, c, e, f, g, h | 3 |
| T | b, c, e, f, h | a, d, g, i | 2 |

*(Resistance Elements 1402a-b must be switched so as to be in-circuit)

Note that other combinations of states for the variable-type multi-state attenuator 1400 are also possible with different switch settings. For example, for the 1st row of TABLE 8 (i.e., Pi type), switches 'a' and 'c' could be OFF (Open) and switches 'b' and 'd' could be ON (Closed), depending on what series resistance combination is required for a particular attenuation value. In general, a user may select not only the type of multi-state attenuator, but also a wide variety of attenuation values for that type of multi-state attenuator simply by judicious selection of configuration switches 1406a-i to form various combinations of the resistance elements 1402a-f.

While a particular multifunctional variable-type, multi-state attenuator is disclosed, other variants may be configured. For example, if a T-type multi-state attenuator configuration is not needed, then configuration switches 1402b-f can be removed and switches 1402a & 1402d can be shorted, leaving the ability of the altered configuration to be programmatically configured as any of a bridged-T type, pi-type, or L-pad type multi-state attenuator. For higher attenuation values, a pi-type is preferred, but for lower attenuation, T-type or bridged-T type is preferred. Changing to the L-pad type enables changing the attenuation range or the output impedance (L-pad attenuators provide asymmetric impedance at the two ports).

Calibration and Configuration

Each attenuation path in a multi-state attenuator may be tested and characterized by conventional testing means used for attenuators (particularly digital step attenuators), and packaged in a manner suitable for RF circuits, either alone or as part of a larger circuit or system.

Calibration of a multi-state attenuator may be performed by comparing each attenuation state with a reference state (i.e., the state of the attenuator with no intentional attenuation selected). The loss in the attenuation state minus the loss in the reference state is the actual attenuation for the selected state. Adjustment in the actual attenuation can be accomplished by selecting the attenuation state in a multi-state attenuator that best matches a desired level.

A variable type multi-state attenuator may be configured in various ways (typically as part of the calibration process), such as at the time of manufacture (e.g., by application of one or more mask layers to set a configuration), after testing or by a customer (e.g., by "blowing" fusible links), or under program control (e.g., by the use of look-up tables external or internal to an IC that includes the variable type multi-state attenuator).

As noted, a look-up table may be used to control which individual resistor is switched in or out of the signal path depending upon the desired level of attenuation. When designing the resistor network, a resistor/or combination of resistors may be selected to provide the different desired attenuation levels, and thus define the different attenuation states. Every attenuation state can be logically mapped to a resistor or a combination of resistors, which further can be logically mapped to one or more corresponding switches (i.e., the FET switches which connect or disconnect a particular resistor to/from the circuitry). Thus, a lookup table can be prepared (typically as part of the calibration process) with switch control data that maps each desired attenuation state (e.g., a binary number from 0-7) to a physical state of the switches (i.e., ON and OFF switch states), which corresponds to the physical circuit status of each resistor (i.e., in or out of circuit).

While a fixed-type multi-state attenuator may be set for one of several attenuator states, in some applications it may be useful to fix the attenuator state to a particular value. For example, where one multi-state attenuator part is intended to be used as a single-value attenuator in different applications, but with a different attenuation state for those different applications. Accordingly, as with the variable type multi-state attenuator, a fixed-type multi-state attenuator may be configured in various ways, such as at the time of manufacture (e.g., by application of one or more mask layers to set a configuration), after testing or by a customer (e.g., by "blowing" fusible links), or under program control (e.g., by the use of look-up tables external or internal to an IC that includes the multi-state attenuator).

It should be noted that for both a variable type multi-state attenuator and a fixed-type multi-state attenuator, program control of the type and/or attenuation state can be based on a user selection or external control signal, directly or indirectly (e.g., selection of a frequency band may by mapped to a specific attenuation state), or automatically set in response to detected states or parameters (e.g., detected signal frequency, signal strength, power consumption, IC device temperature, etc.).

Methods

Another aspect of the invention includes a method for providing multi-state attenuation for a radio frequency signal, including:

selectably coupling an applied radio frequency signal from an input terminal to an output terminal of a throughput section through one of the at least two selectable signal attenuation paths to provide a corresponding attenuation state for the applied radio frequency signal; and selectively coupling at least one connection node of the throughput section through a shunt section to a reference voltage, the shunt section including (1) at least one selectable shunt switch, and (2) at least two series-connected impedance elements coupled in series with a corresponding one of the at least one selectable shunt switch, at least one of the at least two series-connected impedance elements being selectably configurable to provide at least two impedance states for the shunt section, each impedance state corresponding to an attenuation state of the throughput section.

Additional aspects of such method include one or more of the following: the selectable shunt switch includes two or more concurrently switchable stacked switching elements; selectably coupling the applied radio frequency signal from the input terminal to the output terminal through a selectable bypass path to provide a through state for the applied radio frequency signal; the selectable bypass path includes two or more concurrently switchable stacked switching elements; arranging the throughput section and the shunt section in one or more of a bridged-T type multi-state attenuator configuration, a pi-type multi-state attenuator configuration, or a T-type multi-state attenuator configuration, including the ability to select the attenuator type programmatically; at least one shunt section series-connected impedance element includes at least one bypassable series resistance; the at least one shunt section series-connected impedance element includes at least one fixed resistance in series with at least one series-connected bypassable resistance; the at least one shunt section series-connected impedance element includes at least one fixed resistance in series with at least two bypassable parallel resistances; at least one throughput section selectable signal attenuation path includes at least one selectable series resistance element; at least one selectable series resistance element includes two or more concurrently switchable stacked switching elements; at least two throughput section selectable signal attenuation paths are in parallel with each other between the input terminal and the output terminal; at least one throughput section selectable signal attenuation path includes at least one selectable series resistance element in series with at least one bypassable augmenting resistance element; at least two throughput section selectable signal attenuation paths are series-connected bypassable resistance elements; at least two throughput section selectable signal attenuation paths are tiered bypassable series resistances; and fabricating the multi-state attenuator as a complementary metal-oxide-semiconductor integrated circuit using a silicon-on-insulator process.

Fabrication

Embodiments of the multi-state attenuators described above may be fabricated as a monolithic or hybrid circuit. However, there are numerous advantages to embodying the circuit concepts described above in complementary metal-oxide-semiconductor (CMOS) integrated circuits (ICs) using stacked FET switches fabricated with a silicon-on-insulator (SOI) process (which includes silicon-on-sapphire, or SOS). In particular, stacked FET switches provide an improvement in the linearity of the circuit by allowing each switch to operate in a less stressed, and therefore more linear, region. Fabrication in CMOS on SOI or SOS also enables low power consumption, the ability to withstand high power signals during operation due to FET stacking, good linearity, and high frequency operation (in excess of 10 GHz).

Monolithic IC implementation is particularly useful since parasitic capacitances generally can be kept low by careful design. However, while the embodiments described above have utilized FET switches, the inventive concepts extend to other switch technologies, such as RF microelectromechanical system (MEMS) switches.

Further, as should be readily apparent to one of ordinary skill in the art, various embodiments of the invention can be implemented to meet a wide variety of specifications. Thus, selection of suitable component values are a matter of design choice unless otherwise noted above. Various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components to handle greater voltages, and/or using multiple components in parallel to handle greater currents.

While the term "MOSFET" technically refers to metal-oxide-semiconductors, it has become a common label for most types of IGFETs. It is well known that the "metal" in the name MOSFET is now often a misnomer because the previously metal gate material is now often a layer of polysilicon (polycrystalline silicon). Similarly, the "oxide" in the name can be a misnomer, as different dielectric materials are used with the aim of obtaining strong channels with smaller applied voltages. Another synonym for MOSFET is "MISFET", for metal-insulator-semiconductor FET. Accordingly, the term "MOSFET" as used herein is not to be read as literally limited to metal-oxide-semiconductors.

Uses

Multi-state attenuator and variable type multi-state attenuators are useful in a wide variety of circuits for performing a range of functions, including (but not limited to) digital step attenuator (DSA) circuits, impedance matching circuits (especially the L-type multi-state attenuator, which presents asymmetric impendences at the two RF ports), power amplifiers (e.g., scalable periphery tunable matching power amplifiers, and Doherty amplifiers), phase shifters, RF switches, etc. Such functions are particularly useful in such applications as radar systems (including phase array and automotive radar systems), and radio systems. Radio system usage includes (again, without limitation) cellular radios systems (including base stations, relay stations, and hand-held transceivers) that use such standards as Code Division Multiple Access ("CDMA"), Wide Band Code Division Multiple Access ("W-CDMA"), Worldwide Interoperability for Microwave Access ("WIMAX"), Global System for Mobile Communications ("GSM"), Enhanced Data Rates for GSM Evolution (EDGE), Long Term Evolution ("LTE"), as well as other radio communication standards and protocols.

Multi-state attenuator and variable type multi-state attenuators of the type described above are useful in applications where signal transients ("glitches") that may occur between state transitions have to be reduced.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A programmable multi-state attenuator for a radio frequency signal, including:

(a) a throughput section having an input terminal, an output terminal, at least one connection node, and at least two selectable signal attenuation paths coupled between the input terminal and the output terminal, for selectably coupling an applied radio frequency signal from the input terminal to the output terminal through one of the at least two selectable signal attenuation paths to provide a corresponding attenuation state for the applied radio frequency signal; and (b) a shunt section, coupled between the at least one connection node of the throughput section and a reference voltage, for selectively coupling the at least one connection node to the reference voltage, the shunt section including (1) at least one selectable shunt switch, and (2) at least two series-connected impedance elements coupled in series with a corresponding one of the at least one selectable shunt switch, at least one of the at least two series-connected impedance elements being selectably configurable to provide at least two impedance states for the shunt section, each impedance state corresponding to an attenuation state of the throughput section.

2. The programmable multi-state attenuator of claim 1, wherein the selectable shunt switch includes two or more concurrently switchable stacked switching elements.

3. The programmable multi-state attenuator of claim 1, further including a selectable bypass path between the input terminal and the output terminal, for selectably coupling an applied radio frequency signal from the input terminal to the output terminal through the selectable bypass path to provide a through state for the applied radio frequency signal.

4. The programmable multi-state attenuator of claim 2, wherein the selectable bypass path includes two or more concurrently switchable stacked switching elements.

5. The programmable multi-state attenuator of claim 1, wherein the throughput section and the shunt section are arranged in a bridged-T type multi-state attenuator configuration.

6. The programmable multi-state attenuator of claim 1, wherein the throughput section and the shunt section are arranged in a pi-type multi-state attenuator configuration.

7. The programmable multi-state attenuator of claim 1, wherein the throughput section and the shunt section are arranged in a T-type multi-state attenuator configuration.

8. The programmable multi-state attenuator of claim 1, wherein the throughput section and the shunt section are arranged in L-pad type multi-state attenuator configuration.

9. The programmable multi-state attenuator of claim 1, wherein at least one shunt section series-connected impedance element includes at least one bypassable series resistance.

10. The programmable multi-state attenuator of claim 1, wherein the at least one shunt section series-connected impedance element includes at least one fixed resistance in series with at least one series-connected bypassable resistance.

11. The programmable multi-state attenuator of claim 1, wherein the at least one shunt section series-connected impedance element includes at least one fixed resistance in series with at least two bypassable parallel resistances.

12. The programmable multi-state attenuator of claim 1, wherein the at least one shunt section series-connected impedance element includes a programmable matrix of selectable resistance elements.

13. The programmable multi-state attenuator of claim 1, wherein at least one throughput section selectable signal attenuation path includes at least one selectable series resistance element.

14. The programmable multi-state attenuator of claim 13, wherein at least one selectable series resistance element includes two or more concurrently switchable stacked switching elements.

15. The programmable multi-state attenuator of claim 1, wherein at least two throughput section selectable signal attenuation paths are in parallel with each other between the input terminal and the output terminal.

16. The programmable multi-state attenuator of claim 1, wherein at least one throughput section selectable signal attenuation path includes at least one selectable series resistance element in series with at least one bypassable augmenting resistance element.

17. The programmable multi-state attenuator of claim 1, wherein at least two throughput section selectable signal attenuation paths are series-connected bypassable resistance elements.

18. The programmable multi-state attenuator of claim 1, wherein at least two throughput section selectable signal attenuation paths are tiered bypassable series resistances.

19. The programmable multi-state attenuator of claim 1, wherein at least one throughput section selectable signal attenuation path includes a programmable matrix of selectable resistance element.

20. The programmable multi-state attenuator of claim 1, wherein the throughput section and the shunt section are selectively configurable to create a multifunctional variable-type multi-state attenuator.

21. The programmable multi-state attenuator of claim 1, wherein the throughput section and the shunt section are selectively configurable between at least two different multi-state attenuator types selected from the group comprising a bridged-T type, a pi-type, a T-type, and an L-pad type attenuator.

22. The programmable multi-state attenuator of claim 1, wherein the multi-state attenuator is fabricated as a complementary metal-oxide-semiconductor integrated circuit using a silicon-on-insulator process.

23. A complementary metal-oxide-semiconductor integrated circuit programmable multi-state attenuator for a radio frequency signal, including:
(a) a throughput section having an input terminal, an output terminal, at least one connection node, at least two selectable signal attenuation paths coupled between the input terminal and the output terminal, and a selectable bypass path between the input terminal and the output terminal, for selectably coupling an applied, radio frequency signal from the input terminal to the output terminal through one of the at least two selectable signal attenuation paths or through the selectable bypass path to provide a corresponding attenuation state or through state for the applied radio frequency signal; and
(b) a shunt section, coupled between the at least one connection node of the throughput section and a reference voltage, for selectively coupling the at least one connection node to the reference voltage, the shunt section including (1) at least one selectable shunt switch including two or more concurrently switchable stacked switching elements, and (2) at least two series-connected impedance elements coupled in series with a corresponding one of the at least one selectable shunt switch, at least one of the at least two series-connected impedance elements being selectably configurable to provide at least two impedance states for the shunt section, each impedance state corresponding to an attenuation state of the throughput section.

24. An integrated circuit programmable multi-state bridged-T type attenuator for a radio frequency signal, including:
(a) a throughput section having an input terminal, an output terminal, a first resistance coupled between the input terminal and a connection node, a second resistance coupled between the connection node and the output terminal, at least two selectable signal attenuation paths coupled between the input terminal and the output terminal, and a selectable bypass path between the input terminal and the output terminal, for selectably coupling an applied radio frequency signal from the input terminal to the output terminal through one of the at least two selectable signal attenuation paths or through the selectable bypass path to provide a corresponding attenuation state or through state for the applied radio frequency signal; and (b) a shunt section, coupled between the connection node of the throughput section and a reference voltage, for selectively coupling the connection node to the reference voltage, the shunt section including (1) at least one selectable shunt switch including two or more concurrently switchable stacked switching elements, and (2) at least two series-connected impedance elements coupled in series with a corresponding one of the at least one selectable shunt switch, at least one of the at least two series-connected impedance elements being selectably configurable to provide at least two impedance states for the shunt section, each impedance state corresponding to an attenuation state of the throughput section.

25. An integrated circuit programmable multi-state pi-type attenuator for a radio frequency signal, including:
(a) a throughput section having an input terminal, an output terminal, at least two selectable signal attenuation paths coupled between the input terminal and the output terminal, and a selectable bypass path between the input terminal and the output terminal, for selectably coupling an applied radio frequency signal from the input terminal to the output terminal through one of the at least two selectable signal attenuation paths or through the selectable bypass path to provide a corresponding attenuation state or through state for the applied radio frequency signal; and
(b) a shunt section, for selectively separately coupling the input terminal and the output terminal to a reference voltage, the shunt section including (1) a first selectable shunt switch including two or more concurrently switchable stacked switching elements and coupled between the input terminal of the throughput section and the reference voltage, (2) a second selectable shunt switch including two or more concurrently switchable stacked switching elements and coupled between the output terminal of the throughput section and the reference voltage, and (3) at least two sets of series-connected impedance elements, each set coupled in series with a corresponding one of the first and second selectable shunt switches, wherein each set of series-connected impedance elements is selectably configurable to provide at least two impedance states for the shunt section, each impedance state corresponding to an attenuation state of the throughput section.

26. An integrated circuit programmable multi-state T-type attenuator for a radio frequency signal, including:
(a) a throughput section having an input terminal, an output terminal, a connection node situated between the input terminal and the output terminal, at least two selectable signal attenuation paths coupled between the input terminal and the output terminal and passing through the connection node, and a selectable bypass path between the input terminal and the output terminal, for selectably coupling an applied radio frequency signal from the input terminal to the output terminal through one of the at least two selectable signal attenuation paths or through the selectable bypass path to provide a corresponding attenuation state or through state for the applied radio frequency signal; and
(b) a shunt section, coupled between the connection node of the throughput section and a reference voltage, for selectively coupling the connection node to the reference voltage, the shunt section including (1) at least one selectable shunt switch including two or more concurrently switchable stacked switching elements, and (2) at least two series-connected impedance elements coupled in series with a corresponding one of the at least one selectable shunt switch, at least one of the at least two series-connected impedance elements being selectably configurable to provide at least two impedance states for the shunt section, each impedance state corresponding to an attenuation state of the throughput section.

27. An integrated circuit programmable multi-state L-pad type attenuator for a radio frequency signal, including:
(a) a throughput section having an input terminal, an output terminal, and at least two selectable signal attenuation paths coupled between the input terminal and the output terminal, and a selectable bypass path between the input terminal and the output terminal, for selectably coupling an applied radio frequency signal from the input terminal to the output terminal through one of the at least two selectable signal attenuation paths or through the selectable bypass path to provide a corresponding attenuation state or through state for the applied radio frequency signal; and
(b) a shunt section, coupled between the connection node of the throughput section and a reference voltage, for selectively coupling the output terminal to the reference voltage, the shunt section including (1) at least one selectable shunt switch including two or more concurrently switchable stacked switching elements, and (2) at least two series-connected impedance elements coupled in series with a corresponding one of the at least one selectable shunt switch, at least one of the at least two series-connected impedance elements being selectably configurable to provide at least two impedance states for the shunt section, each impedance state corresponding to an attenuation state of the throughput section.

28. A method for providing multi-state attenuation for a radio frequency signal, including:
(a) selectably coupling an applied radio frequency signal from an input terminal to an output terminal of a throughput section through one of the at least two selectable signal attenuation paths to provide a corresponding attenuation state for the applied radio frequency signal; and
(b) selectively coupling at least one connection node of the throughput section through a shunt section to a reference voltage, the shunt section including (1) at least one selectable shunt switch, and (2) at least two series-connected impedance elements coupled in series with a corresponding one of the at least one selectable shunt switch, at least one of the at least two series-connected impedance elements being selectably configurable to provide at least two impedance states for the shunt section, each impedance state corresponding to an attenuation state of the throughput section.

29. The method of claim 28, wherein the selectable shunt switch includes two or more concurrently switchable stacked switching elements.

30. The method of claim 28, further including selectably coupling the applied radio frequency signal from the input terminal to the output terminal through a selectable bypass path to provide a through state for the applied radio frequency signal.

31. The method of claim 30, wherein the selectable bypass path includes two or more concurrently switchable stacked switching elements.

32. The method of claim 28, further including arranging the throughput section and the shunt section in a bridged-T type multi-state attenuator configuration.

33. The method of claim 28, further including arranging the throughput section and the shunt section in a pi-type multi-state attenuator configuration.

34. The method of claim 28, further including arranging the throughput section and the shunt section in a T-type multi-state attenuator configuration.

35. The method of claim 28, further including arranging the throughput section and the shunt section in an L-pad type multi-state attenuator configuration.

36. The method of claim 28, wherein at least one shunt section series-connected impedance element includes at least one bypassable series resistance.

37. The method of claim 28, wherein the at least one shunt section series-connected impedance element includes at least one fixed resistance in series with at least one series-connected bypassable resistance.

38. The method of claim 28, wherein the at least one shunt section series-connected impedance element includes at least one fixed resistance in series with at least two bypassable parallel resistances.

39. The method of claim 28, wherein the at least one shunt section series-connected impedance element includes a programmable matrix of selectable resistance elements.

40. The method of claim 28, wherein at least one throughput section selectable signal attenuation path includes at least one selectable series resistance element.

41. The method of claim 40, wherein at least one selectable series resistance element includes two or more concurrently switchable stacked switching elements.

42. The method of claim 28, wherein at least two throughput section selectable signal attenuation paths are in parallel with each other between the input terminal and the output terminal.

43. The method of claim 28, wherein at least one throughput section selectable signal attenuation path includes at least one selectable series resistance element in series with at least one bypassable augmenting resistance element.

44. The method of claim 28, wherein at least two throughput section selectable signal attenuation paths are series-connected bypassable resistance elements.

45. The method of claim 28, wherein at least two throughput section selectable signal attenuation paths are tiered bypassable series resistances.

46. The method of claim 28, wherein at least one throughput section selectable signal attenuation paths includes a programmable matrix of selectable resistance elements.

47. The method of claim 28, further including selectively configuring the throughput section and the shunt section as a multifunctional variable-type multi-state attenuator.

48. The method of claim 28, further including selectively configuring the throughput section and the shunt section between at least two different multi-state attenuator types selected from the group comprising a bridged-T type, a pi-type, a T-type, and an L-pad type attenuator.

49. The method of claim 28, further including fabricating the multi-state attenuator as a complementary metal-oxide-semiconductor integrated circuit using a silicon-on-insulator process.

* * * * *